(12) United States Patent
Uchida et al.

(10) Patent No.: US 9,306,006 B2
(45) Date of Patent: Apr. 5, 2016

(54) SILICON CARBIDE SEMICONDUCTOR DEVICE

(71) Applicant: Sumitomo Electric Industries, Ltd., Osaka-shi (JP)

(72) Inventors: Kosuke Uchida, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/803,435

(22) Filed: Jul. 20, 2015

(65) Prior Publication Data

US 2016/0027878 A1   Jan. 28, 2016

(30) Foreign Application Priority Data

Jul. 24, 2014  (JP) .................................. 2014-151003
May 27, 2015  (JP) .................................. 2015-107340

(51) Int. Cl.
| | | |
|---|---|---|
| *H01L 29/16* | (2006.01) |
| *H01L 29/04* | (2006.01) |
| *H01L 29/78* | (2006.01) |
| *H01L 29/423* | (2006.01) |

(52) U.S. Cl.
CPC .......... *H01L 29/1608* (2013.01); *H01L 29/045* (2013.01); *H01L 29/4236* (2013.01); *H01L 29/78* (2013.01)

(58) Field of Classification Search
None
See application file for complete search history.

(56) References Cited

U.S. PATENT DOCUMENTS

| | | | | |
|---|---|---|---|---|
| 2012/0193643 A1* | 8/2012 | Masuda | .............. | H01L 29/1095 257/77 |
| 2013/0001685 A1* | 1/2013 | Shirakawa | .......... | H01L 29/7816 257/335 |
| 2013/0140586 A1* | 6/2013 | Takahashi | ........... | H01L 29/1608 257/77 |

FOREIGN PATENT DOCUMENTS

JP        2012-033731 A      2/2012

OTHER PUBLICATIONS

Brett A. Hull et al., "Performance of 60A, 1200V 4H-SiC DMOSFETs," Materials Science Forum, Trans Tech Publication Inc., Mar. 2009, Vols. 615-617, pp. 749-752.

* cited by examiner

*Primary Examiner* — Yasser A Abdelaziez
(74) *Attorney, Agent, or Firm* — Venable LLP; Michael A. Sartori

(57) ABSTRACT

There is provided a silicon carbide semiconductor device allowing for suppression of breakage of an element upon short circuit of load. A MOSFET includes a silicon carbide layer, a gate insulating film, a gate electrode, a source electrode, and a drain electrode. The silicon carbide layer includes a drift region, a body region, and a source region. The MOSFET is configured such that a relational expression of $n < -0.02 R_{onA} + 0.7$ is established in a case where a contact width of the source region and the source electrode is represented by n (μm) in a cross section in a thickness direction of the silicon carbide layer and a migration direction of carriers in the body region and where on resistance of the MOSFET in a state in which an inversion layer is formed in a channel region is represented by $R_{onA}$ (mΩcm$^2$).

13 Claims, 23 Drawing Sheets

SILICON CARBIDE SEMICONDUCTOR DEVICE

BACKGROUND OF THE INVENTION

1. Field of the Invention

The present disclosure relates to a silicon carbide semiconductor device.

2. Description of the Background Art

An exemplary semiconductor device employing silicon carbide is a MOSFET (Metal Oxide Semiconductor Field Effect Transistor). A MOSFET is a semiconductor device permitting conduction and interruption of electric current between a source electrode and a drain electrode by controlling whether to form an inversion layer in a channel region in accordance with a threshold value of gate voltage. An exemplary MOSFET (SiC-MOSFET) employing silicon carbide is disclosed in, for example, Japanese Patent Laying-Open No. 2012-33731 and Brett A. Hull, Charlotte Jonas, Sei-Hyung Ryu, Mrinal Das, Michael O'Loughlin, Fatima Husna, Robert Callanan, Jim Richmond, Anant Agarwal, John Palmour and Charles Scozzie, "Performance of 60 A, 1200V 4H-SiC DMOSFETs", Materials Science Forum, Switzerland, Trans Tech Publications Inc., March, 2009, Vols. 615-617, pp 749-752. In Japanese Patent Laying-Open No. 2012-33731, a SiC-MOSFET is disclosed which has improved short circuit capacity. Meanwhile, a current-voltage characteristic, on resistance, and the like of a SiC-MOSFET are discussed in Brett A. Hull, Charlotte Jonas, Sei-Hyung Ryu, Mrinal Das, Michael O'Loughlin, Fatima Husna, Robert Callanan, Jim Richmond, Anant Agarwal, John Palmour and Charles Scozzie, "Performance of 60 A, 1200V 4H-SiC DMOSFETs", Materials Science Forum, Switzerland, Trans Tech Publications Inc., March, 2009 Vols. 615-617, pp 749-752.

SUMMARY OF THE INVENTION

A silicon carbide semiconductor device according to the present disclosure includes a silicon carbide layer, a gate insulating film, a gate electrode, a first electrode, and a second electrode. The silicon carbide layer includes a first main surface and a second main surface opposite to the first main surface. The silicon carbide layer includes a first impurity region, a second impurity region, and a third impurity region. The first impurity region has a first conductivity type. The second impurity region is in contact with the first impurity region and has a second conductivity type different from the first conductivity type. The third impurity region constitutes a portion of the first main surface, is formed to interpose the second impurity region between the third impurity region and the first impurity region, and has the first conductivity type. The gate insulating film is formed on the second impurity region. The gate electrode is formed on the gate insulating film. The first electrode is in contact with the third impurity region in the first main surface and is electrically connected to the third impurity region. The second electrode is formed on the second main surface and is electrically connected to the silicon carbide layer. The silicon carbide semiconductor device is configured such that migration of carriers between the first electrode and the second electrode is controlled by controlling a voltage applied to the gate electrode. The silicon carbide semiconductor device is configured such that a relational expression of $n < -0.02 R_{onA} + 0.7$ is established in a case where a contact width of the third impurity region and the first electrode is represented by n (μm) in a cross section in a thickness direction of the silicon carbide layer and a migration direction of the carriers in the second impurity region and where on resistance of the silicon carbide semiconductor device in an on state is represented by $R_{onA}$ (mΩcm$^2$).

DETAILED DESCRIPTION OF THE INVENTION

Description of Embodiments

Figure 1:
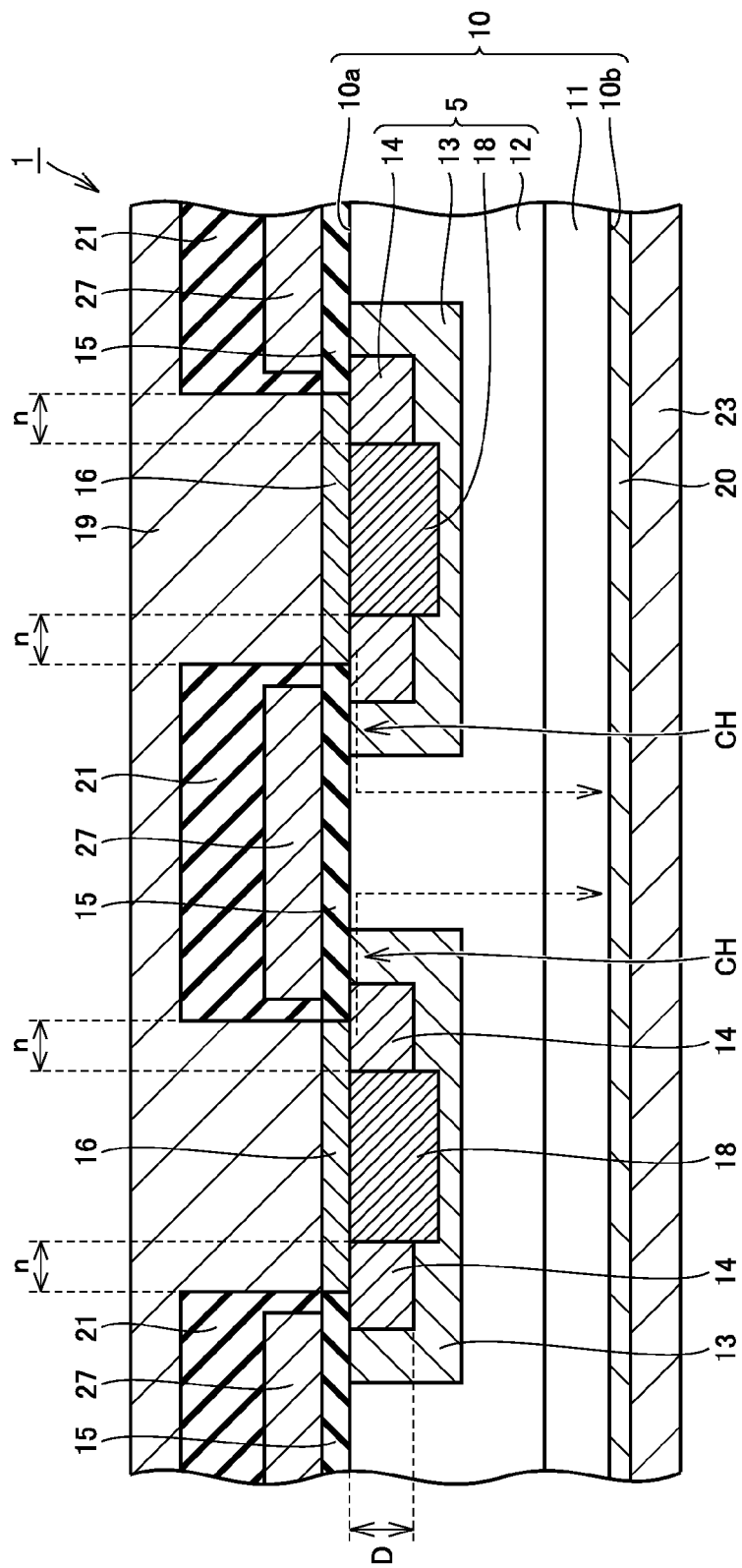
FIG. 1 is a schematic cross sectional view showing a structure of a silicon carbide semiconductor device according to a first embodiment.

The present disclosure has an object to provide a silicon carbide semiconductor device allowing for suppression of breakage of an element upon short circuit of load.

In a MOSFET employing silicon, when increasing a drain voltage applied between a source electrode and a drain electrode under a certain gate voltage, a drain current is increased in a low voltage region having a low drain voltage and the drain current is saturated in a high voltage region having a high drain voltage. Accordingly, even when a high voltage is applied to the MOSFET upon short circuit of load, a large amount of electric current can be suppressed from flowing.

However, when increasing a drain voltage under a certain gate voltage in a MOSFET employing silicon carbide in a similar manner, a drain current is unlikely to be saturated in the high voltage region. Accordingly, a large amount of current may flow in the MOSFET upon short circuit of load to cause increase of temperature of an element, which results in breakage of the element, disadvantageously. In order to prevent the breakage of the element, a technique is required to saturate the drain current more securely in the region having a high drain voltage.

(1) A silicon carbide semiconductor device (MOSFET 1, 2) according to the present disclosure includes a silicon carbide layer 10, a gate insulating film 15, a gate electrode 27, a first electrode (source electrode 16), and a second electrode (drain electrode 20). Silicon carbide layer 10 includes a first main surface 10a and a second main surface 10b opposite to first main surface 10a. Silicon carbide layer 10 includes a first impurity region (drift region 12), a second impurity region (body region 13), and a third impurity region (source region 14). Drift region 12 has a first conductivity type (n type). Body region 13 is in contact with drift region 12 and has a second conductivity type (p type) different from n type. Source region 14 constitutes a portion of first main surface 10a, is formed to interpose body region 13 between source region 14 and drift region 12, and has n type. Gate insulating film 15 is formed on body region 13. Gate electrode 27 is formed on gate insulating film 15. Source electrode 16 is in contact with source region 14 in first main surface 10a and is electrically connected to source region 14. Drain electrode 20 is formed on second main surface 10b and is electrically connected to silicon carbide layer 10. MOSFET 1, 2 is configured such that migration of carriers between source electrode 16 and drain electrode 20 is controlled by controlling a voltage applied to gate electrode 27. MOSFET 1, 2 is configured such that a relational expression of $n<-0.02R_{onA}+0.7$ is established in a case where a contact width of source region 14 and source electrode 16 is represented by n (μm) in a cross section in a thickness direction of silicon carbide layer 10 and a migration direction of the carriers in body region 13 and where on resistance of MOSFET 1, 2 in an on state is represented by $R_{onA}$ (mΩcm$^2$).

Regarding conventional MOSFETs, devices are designed such that the contact width of the source region and the source electrode becomes wider in order to reduce electric resistance between the source region and the source electrode. In contrast, in MOSFET 1, 2 described above, contact width n of source region 14 and source electrode 16 is defined to be less than $-0.02R_{onA}+0.7$. Accordingly, electric resistance of the contact portion of source region 14 and source electrode 16 becomes high as total. Moreover, the electric resistance in the contact portion has a small influence when the current value is small, and the electric resistance in the contact portion has a large influence when the current value is large. As a result, the drain current can be maintained in the region having a low drain voltage, and the drain current can be reduced in the region having a high drain voltage. By thus reducing the drain current in the high voltage region, a large amount of current can be suppressed from flowing in MOSFET 1, 2 even if a high voltage is applied to MOSFET 1, 2 upon short circuit of load. Therefore, according to MOSFET 1, 2, an element can be suppressed from being broken upon short circuit of load.

(2) Preferably, MOSFET 1, 2 is configured such that a relational expression of $n \leq -0.02R_{onA}+0.6$ is established. By thus defining the upper limit value of contact width n of source region 14 and source electrode 16 to be $-0.02R_{onA}+0.6$, the drain current in the high voltage region can be reduced more effectively as described above. As a result, an element can be suppressed more effectively from being broken upon short circuit of load.

(3) Preferably, MOSFET 1, 2 is configured such that the on resistance is not less than 1 mΩcm$^2$ and not more than 15 mΩcm$^2$. When the on resistance is less than 1 mΩcm$^2$, the breakdown voltage of the device becomes small. On the other hand, when the on resistance is more than 15 mΩcm$^2$, loss in the device becomes large. Hence, the on resistance is preferably not less than 1 mΩcm$^2$ and not more than 15 mΩcm$^2$.

(4) Preferably in MOSFET 1, 2, contact width n is not less than 0.1 μm. When contact width n is less than 0.1 μm, electric resistance in the contact portion of source region 14 and source electrode 16 becomes too large, thus resulting in large loss in the device. Therefore, preferably, in order to suppress the breakage of element and suppress loss in the device, contact width n is defined to be less than $-0.02R_{onA}+0.7$ (preferably, not more than $-0.02R_{onA}+0.6$) and the lower limit value thereof is defined to be 0.1 μm.

(5) Preferably, MOSFET 1, 2 is configured such that contact resistance between source electrode 16 and source region 14 is not more than $1 \times 10^{-5}$ mΩcm$^2$. When the contact resistance is more than $1 \times 10^{-5}$ mΩcm$^2$, the drain current is decreased also in the region having a low drain voltage, thus resulting in large loss in the device. Accordingly, the contact resistance is preferably not more than $1 \times 10^{-5}$ mΩcm$^2$.

(6) Preferably, MOSFET 1 is configured such that the migration of the carriers is controlled by controlling whether to form an inversion layer in a channel region CH of body region 13. MOSFET 1 is configured such that the inversion layer is formed in channel region CH in the on state.

(7) Preferably in MOSFET 1, body region 13 constitutes a portion of first main surface 10a. MOSFET 1 is configured to control whether to form the inversion layer in channel region CH, which is a region adjacent to first main surface 10a in body region 13. Thus, planer type MOSFET 1 can be employed in the silicon carbide semiconductor device according to the present disclosure.

(8) Preferably in MOSFET 2, a trench TR is formed in silicon carbide layer 10 to have an opening at the first main surface 10a side and have a side wall surface SW on which a portion of body region 13 is exposed. MOSFET 2 is configured to control whether to form the inversion layer in channel region CH, which is a region adjacent to side wall surface SW in body region 13. Thus, trench type MOSFET 2 can be employed in the silicon carbide semiconductor device according to the present disclosure.

(9) Preferably in MOSFET 2, on side wall surface SW of trench TR, body region 13 is provided with a surface including a first plane S1 having a plane orientation of {0-33-8}. Accordingly, channel resistance in side wall surface SW can be reduced. As a result, the on resistance of MOSFET 2 can be reduced.

(10) Preferably in MOSFET 2, the surface microscopically includes first plane S1. The surface microscopically further includes a second plane S2 having a plane orientation of {0-11-1}. Accordingly, the channel resistance in side wall surface SW can be reduced further. As a result, the on resistance of MOSFET 2 can be reduced further.

(11) Preferably in MOSFET 2, first and second planes S1, S2 of the surface constitutes a combined plane SR having a plane orientation of {0-11-2}. Accordingly, the channel resistance in side wall surface SW can be reduced further. As a result, the on resistance of MOSFET 2 can be reduced further.

(12) Preferably in MOSFET 2, the surface macroscopically has an off angle of 62°±10° relative to a {000-1} plane. Accordingly, the channel resistance in side wall surface SW can be reduced further. As a result, the on resistance of MOSFET 2 can be reduced further.

(13) Preferably, MOSFET 1, 2 is configured such that a current density in source region 14 is not more than 30000 A/cm$^2$ when a voltage of 20 V is applied to gate electrode 27 and a voltage of not less than 20 V is applied between source electrode 16 and drain electrode 20. Thus, in MOSFET 1, 2 described above, even when a high drain voltage of not less than 20 V is applied, a large amount of current can be suppressed from flowing in MOSFET 1, 2.

Details of Embodiments

Next, specific examples of the embodiments will be described with reference to figures. It should be noted that in the below-mentioned figures, the same or corresponding portions are given the same reference characters and are not described repeatedly. In the present specification, an individual plane is represented by ( ) and a group plane is represented by { }. In addition, a negative index is supposed to be crystallographically indicated by putting "–" (bar) above a numeral, but is indicated by putting the negative sign before the numeral in the present specification.

First Embodiment

Figure 2:
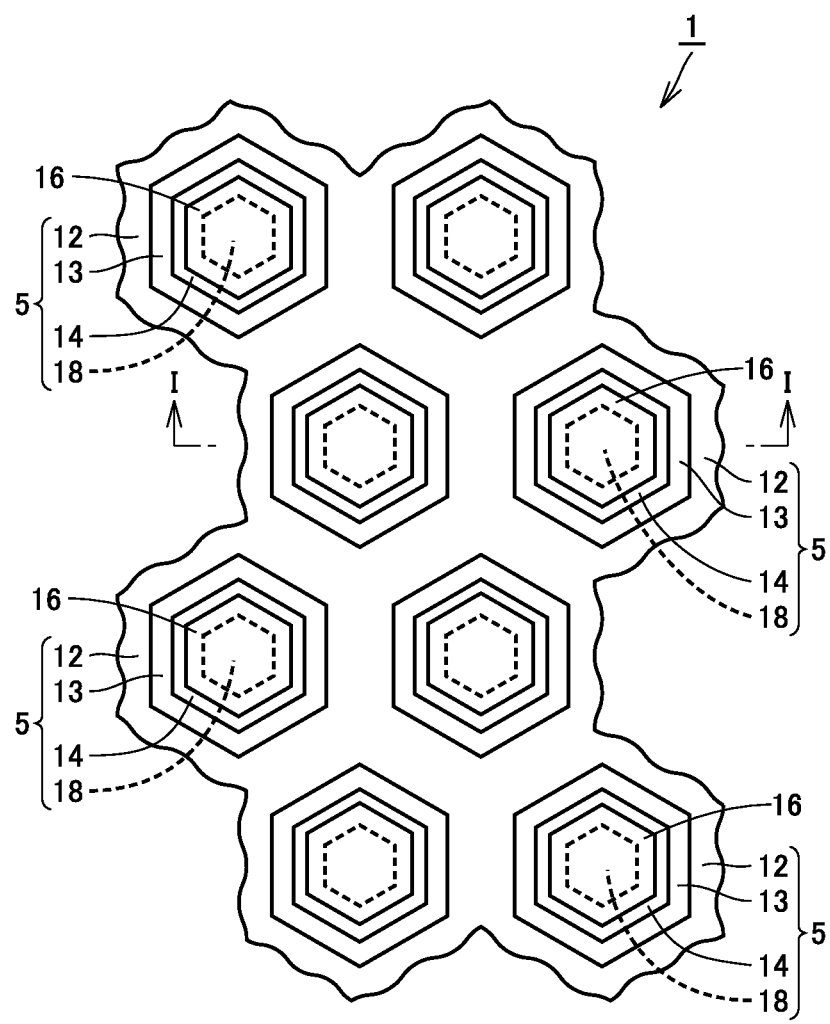
FIG. 2 is a schematic plan view showing the structure of the silicon carbide semiconductor device according to the first embodiment.

First, with reference to FIG. 1 and FIG. 2, the following describes a structure of a MOSFET 1, which is a silicon carbide semiconductor device according to a first embodiment. FIG. 1 shows a cross sectional structure of MOSFET 1 along a line segment I-I in FIG. 2.

With reference to FIG. 1, MOSFET 1 is a planer type MOSFET, and mainly includes a silicon carbide layer 10, gate insulating films 15, gate electrodes 27, source electrodes 16 (first electrode), a drain electrode 20 (second electrode), a source pad electrode 19, a back side pad electrode 23, and interlayer insulating films 21. Silicon carbide layer 10 includes a first main surface 10a and a second main surface 10b opposite to first main surface 10a. Moreover, silicon carbide layer 10 includes a silicon carbide substrate 11 and an epitaxial growth layer 5. Epitaxial growth layer 5 is provided with a drift region 12 (first impurity region), body regions 13 (second impurity region), source regions 14 (third impurity region), and contact regions 18.

Silicon carbide substrate 11 contains an n type impurity such as nitrogen (N) and therefore has n type conductivity. Drift region 12 is formed on one main surface of silicon carbide substrate 11. Drift region 12 contains an n type impurity such as nitrogen (N) and therefore has n type conductivity (first conductivity type). The n type impurity concentration of drift region 12 is less than the n type impurity concentration of silicon carbide substrate 11.

Body region 13 is formed in contact with drift region 12. Moreover, the plurality of body regions 13 are formed in epitaxial growth layer 5 to constitute a portion of first main surface 10a. Moreover, in each body region 13, a region adjacent to first main surface 10a is a channel region CH. During an operation of MOSFET 1, whether to form an inversion layer in channel region CH is controlled. Body region 13 contains a p type impurity such as aluminum (Al) or boron (B), and therefore has p type conductivity (second conductivity type). Moreover, as shown in a plan view of FIG. 2, body region 13 has an outer circumferential shape constituted of a hexagon shape when viewed in a plan view of first main surface 10a.

With reference to FIG. 1, source region 14 is formed in contact with body region 13. Moreover, source region 14 constitutes a portion of first main surface 10a and is formed in body region 13 with body region 13 being interposed between source region 14 and drift regions 12. Source region 14 contains an n type impurity such as phosphorus (P) and therefore has n type conductivity. The n type impurity concentration of source region 14 is more than the n type impurity concentration of drift region 12. Moreover, as shown in the plan view of FIG. 2, source region 14 has an outer circumferential shape constituted of a hexagon shape when viewed in the plan view of first main surface 10a. Moreover, source region 14 is formed inside body region 13 to surround contact region 18.

With reference to FIG. 1, contact region 18 is formed in contact with body region 13. Moreover, contact region 18 constitutes a portion of first main surface 10a and is formed adjacent to source region 14 in body region 13. Contact region 18 contains a p type impurity such as Al and B, and therefore has p type conductivity. The p type impurity concentration of contact region 18 is larger than the p type impurity concentration of body region 13.

Moreover, as shown in the plan view of FIG. 2, contact region 18 has an outer circumferential shape constituted of a hexagon shape when viewed in the plan view of first main surface 10a. Moreover, contact region 18 is formed inside body region 13 and source region 14. Moreover, when viewed in the plan view of first main surface 10a, the area of contact region 18 is not less than 10%, preferably, 15% of the area of body region 13. It should be noted that the areas of body region 13 and contact region 18 respectively refer to the areas of the hexagons constituting the outer circumferential shapes of body region 13 and contact region 18 when viewed in the plan view of first main surface 10a shown in FIG. 2.

With reference to FIG. 1, gate insulating film 15 is formed in contact with a portion of first main surface 10a. More specifically, gate insulating film 15 is formed to extend from above one source region 14 to above the other source region 14 and is located on body region 13. Gate insulating film 15 is made of, for example, silicon dioxide ($SiO_2$) or the like.

Gate electrode 27 is formed on gate insulating film 15. Gate electrode 27 is made of a conductor such as polysilicon having an impurity added therein, or Al, for example. Moreover, gate electrode 27 is formed to extend from above one source region 14 to above the other source region 14.

Source electrode 16 is in contact with each of source region 14 and contact region 18 on first main surface 10a, and is electrically connected to each of source region 14 and contact region 18. Source electrode 16 is made of a material capable of forming ohmic contact with source region 14 and contact region 18, such as at least one material selected from a group consisting of $Ni_xSi_y$ (nickel silicon), $Ti_xSi_y$ (titanium silicon), $Al_xSi_y$ (aluminum silicon), and $Ti_xAl_ySi_z$ (titanium aluminum silicon) (x, y, z>0).

Source electrode 16 has a contact resistance of not more than $1\times10^{-5}$ mΩcm$^2$ with respect to source region 14. Moreover, source electrode 16 has a contact resistance of not less than $1\times10^{-4}$ Ωcm$^2$ and not more than $1\times10^{-1}$ Ωcm$^2$ with respect to contact region 18.

Here, the following describes a relation between a contact width n (μm) of source electrode 16 and source region 14 and on resistance $R_{onA}$ (mΩcm$^2$) of MOSFET 1. In MOSFET 1, in the case where the contact width of source region 14 and source electrode 16 is represented by n and the on resistance of MOSFET 1 is represented by $R_{onA}$, a relational expression of n<−0.02$R_{onA}$+0.7 is established, and preferably a relational expression of n≤−0.02$R_{onA}$+0.6 is established. With the relational expressions, for example, when on resistance $R_{onA}$ is 10 mΩcm$^2$, contact width n is less than 0.5 μm, and preferably is not more than 0.4 μm. Moreover, contact width n is preferably not less than 0.1 μm, and is preferably not less than 0.15 μm. Moreover, contact width n is not more than depth D of source region 14.

As shown in FIG. 1, contact width n is a width in a cross section in the thickness direction of silicon carbide layer 10 and the migration direction of carriers in channel region CH (direction indicated by broken line arrows in FIG. 1). Contact width n can be measured by observing the cross section using, for example, a SEM (Scanning Electron Microscope), a TEM (Transmission Electron Microscope), a SCM (Scanning Capacitance Microscopy), or the like.

As the SEM, Quanta™ 3D FEG provided by FEI can be used, for example. A sample analysis region is 20 μm×20 μm, for example. An acceleration voltage is 2 kV, for example. A probe current is 15 pA, for example. As the TEM, JEM-2100F provided by JEOL can be used, for example. A sample analysis region is 10 μm×10 μm×0.2 μm, for example. An acceleration voltage is 200 kV, for example. As the SCM, Dimension 3100 provided by Bruker AXS can be used, for example. A sample analysis region is 10 μm×15 μm, for example. A modulation voltage is not less than 1 V and not more than 5 V, for example. A frequency is 100 Hz, for example. A DC bias is 0 V, for example.

On resistance $R_{onA}$ is resistance in a state (on state) in which the inversion layer is formed in channel region CH by applying a gate voltage ($V_{GS}$) of not less than the threshold voltage to gate electrode 27. For example, on resistance $R_{onA}$ is not less than 1 mΩcm$^2$ and not more than 15 mΩcm$^2$, and is preferably not less than 10 mΩcm$^2$ and not more than 15 mΩcm$^2$. When on resistance $R_{onA}$ is 1 mΩcm$^2$, MOSFET 1 has a breakdown voltage of 1.2 to 1.7 kV, for example. Moreover, when on resistance $R_{onA}$ is 10 mΩcm$^2$, MOSFET 1 has a breakdown voltage of 1.7 kV, for example. When on resistance $R_{onA}$ is 15 mΩcm$^2$, MOSFET 1 has a breakdown voltage of 3.3 kV, for example. Moreover, on resistance $R_{onA}$ can be measured under conditions that the drain voltage ($V_{DS}$) applied between source electrode 16 and drain electrode 20 is 2V and that oxide film electric field in gate insulating film 15 is 3 MV/cm.

Figure 18:
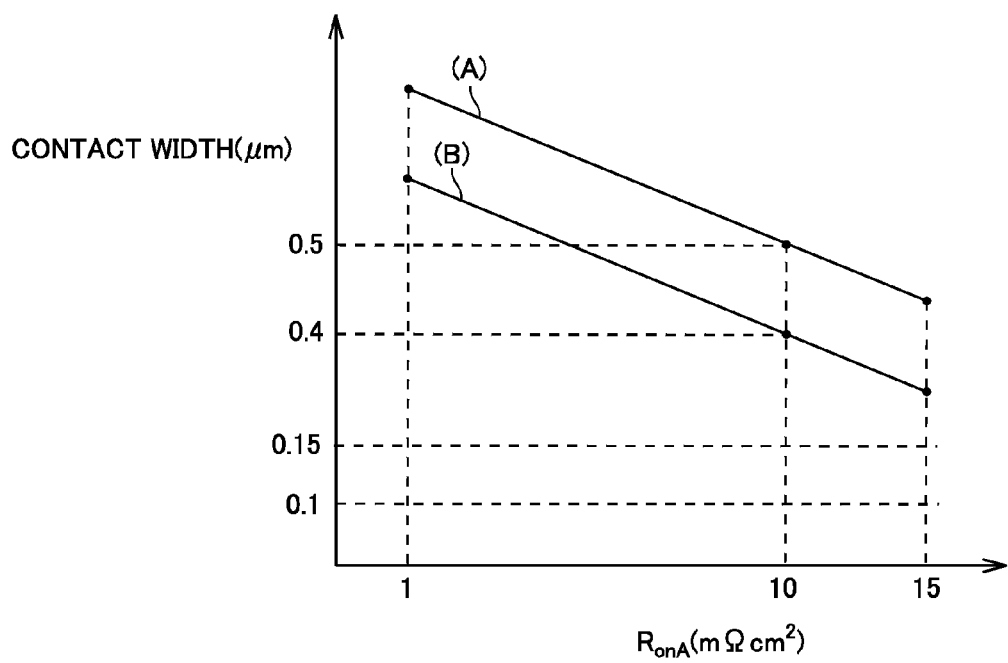
FIG. 18 is a graph showing a relation between on resistance and contact width of a source electrode and a source region.

FIG. 18 is a graph showing a relation between contact width n and on resistance $R_{onA}$ in MOSFET 1. In this graph, the horizontal axis represents on resistance $R_{onA}$ and the vertical axis represents contact width n. Moreover, in this graph, (A) represents a straight line of n=−0.02$R_{onA}$+0.7 and (B) represents a straight line of n=−0.02$R_{onA}$+0.6. Hence, in MOSFET 1, the values of $R_{onA}$ and n can be taken in a region surrounded by the straight line of $R_{onA}$=1, the straight line of $R_{onA}$=15, the straight line of n=0.1, and the straight line (A) in the graph of FIG. 18. Preferably, the values of $R_{onA}$ and n can be taken in a region surrounded by the straight line of $R_{onA}$=1, the straight line of $R_{onA}$=15, the straight line of n=0.15, and the straight line (B).

With reference to FIG. 1, drain electrode 20 is formed on second main surface 10b of silicon carbide substrate 11. Drain electrode 20 is made of, for example, the same material as that of source electrode 16 and is electrically connected to silicon carbide substrate 11.

Interlayer insulating film 21 is formed such that interlayer insulating film 21 and gate insulating film 15 surround gate electrode 27. Accordingly, gate electrode 27 is electrically insulated from source electrode 16 and source pad electrode 19. Interlayer insulating film 21 is made of, for example, an insulator such as $SiO_2$.

Source pad electrode 19 is formed to cover source electrode 16 and interlayer insulating film 21. Source pad electrode 19 is made of, for example, a conductor such as Al, and is electrically connected to source region 14 via source electrode 16. Back side pad electrode 23 is formed to cover drain electrode 20. Back side pad electrode 23 is made of, for example, a conductor such as Al, and is electrically connected to silicon carbide substrate 11 via drain electrode 20.

The following describes an operation of MOSFET 1. With reference to FIG. 1, when a voltage is applied between source electrode 16 and drain electrode 20 while a gate voltage applied to gate electrode 27 is lower than a threshold voltage (off state), a pn junction formed between body region 13 and drift region 12 is reverse-biased. Accordingly, MOSFET 1 is in the non-conductive state. On the other hand, while the gate voltage applied to gate electrode 27 is not less than the threshold voltage (on state), the inversion layer is formed in channel region CH of body region 13. As a result, source region 14 and drift region 12 are electrically connected to each other, whereby a current flows between source electrode 16 and drain electrode 20. In this way, in the operation of MOSFET 1, by applying a voltage to gate electrode 27 to control whether to form the inversion layer in channel region CH of body region 13, migration of carriers between source electrode 16 and drain electrode 20 is controlled. It should be noted that an influence of the contact resistance between source electrode 16 and source region 14 is small during the normal operation of MOSFET 1; however, as the current value becomes larger, the influence of the contact resistance becomes larger.

Figure 3:
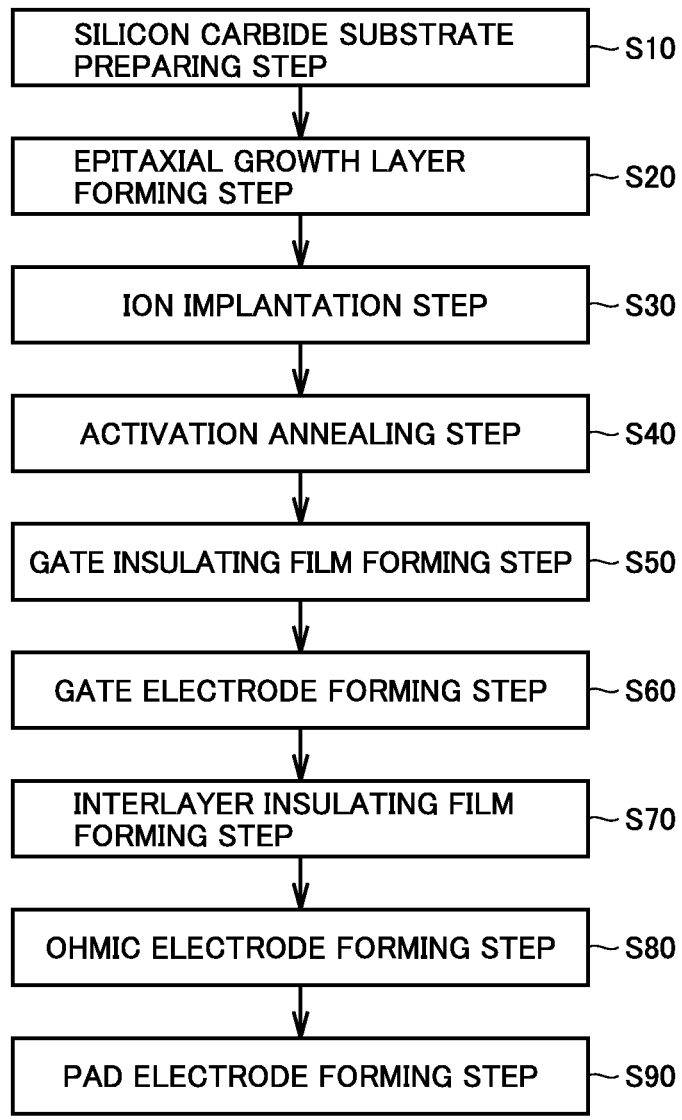
FIG. 3 is a flowchart schematically showing a method for manufacturing the silicon carbide semiconductor device according to the first embodiment.
Figure 4:
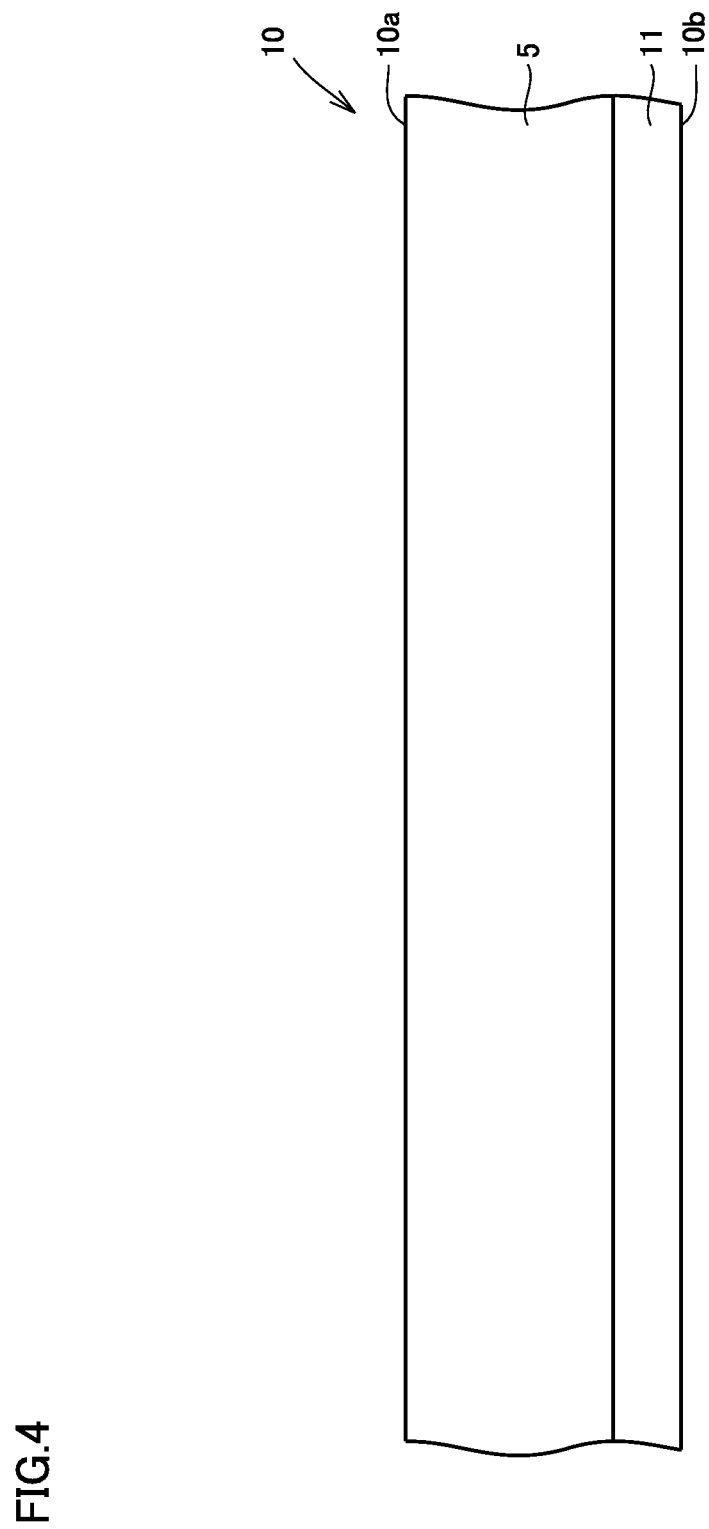
FIG. 4 is a schematic view for illustrating steps (S10) and (S20) in the method for manufacturing the silicon carbide semiconductor device according to the first embodiment.

The following describes a method for manufacturing MOSFET 1. With reference to FIG. 3, a silicon carbide substrate preparing step is first performed as a step (S10). In this step (S10), with reference to FIG. 4, silicon carbide substrate 11 is prepared by cutting an ingot (not shown) made of 4H type single-crystal silicon carbide, for example.

Next, an epitaxial growth layer forming step is performed as a step (S20). In this step (S20), with reference to FIG. 4, for example, a CVD (Chemical Vapor Deposition) method is employed to form, on silicon carbide substrate 11, epitaxial growth layer 5 made of silicon carbide. In this CVD method, silane gas ($SiH_4$) and propane gas ($C_3H_8$) are employed as a source material gas, hydrogen gas ($H_2$) is employed as a carrier gas, and nitrogen gas ($N_2$) is employed as a doping gas, for example.

Figure 5:
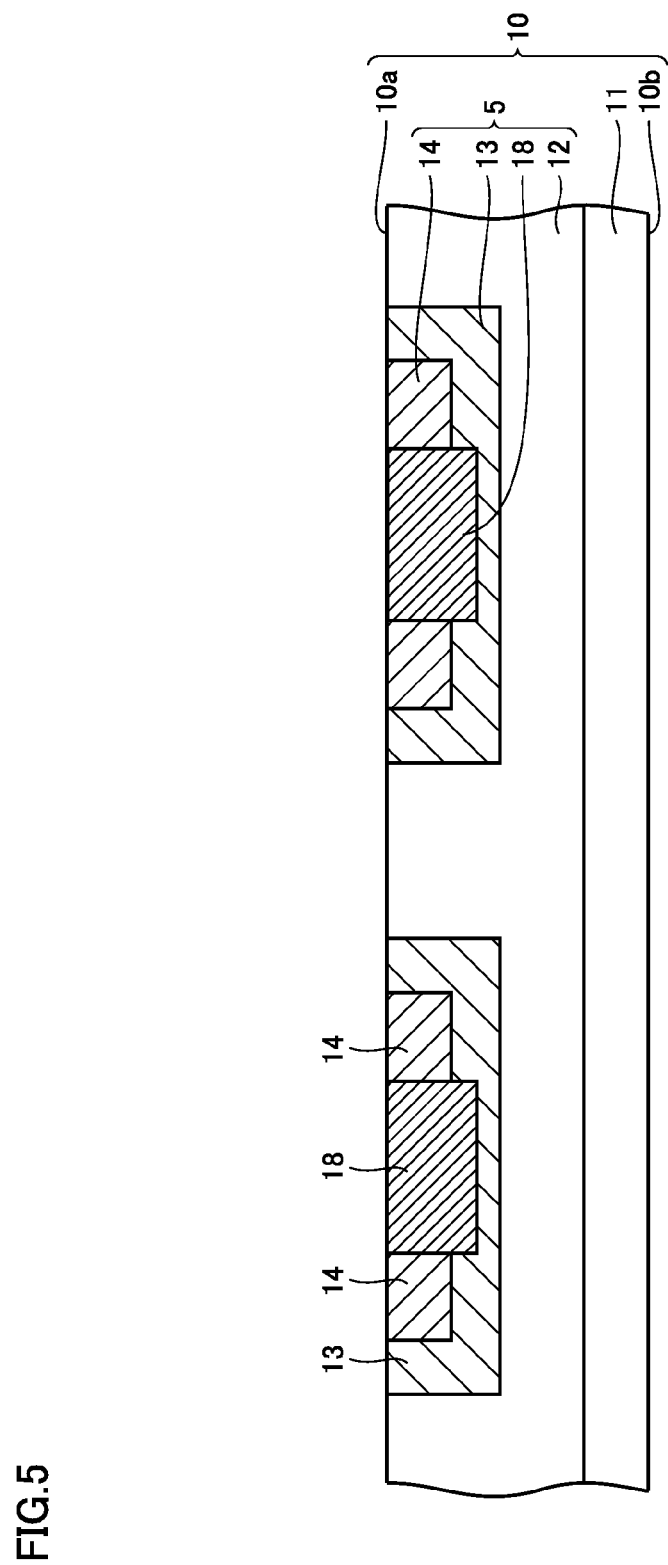
FIG. 5 is a schematic view for illustrating steps (S30) and (S40) in the method for manufacturing the silicon carbide semiconductor device according to the first embodiment.

Next, as a step (S30), an ion implantation step is performed. In this step (S30), with reference to FIG. 5, for example, Al ions are first implanted into epitaxial growth layer 5 from the first main surface 10a side, thereby forming body region 13 in epitaxial growth layer 5. Next, for example, P ions are implanted into body region 13, thereby forming source region 14 in body region 13. Next, for example, Al ions are implanted into body region 13, thereby forming contact region 18 adjacent to source region 14 in body region 13. Here, a ratio of the area of contact region 18 to the area of body region 13 is determined. Further, in epitaxial growth layer 5, a region in which none of body region 13, source region 14, and contact region 18 is formed serves as drift region 12.

Next, as a step (S40), an activation annealing step is performed. In this step (S40), with reference to FIG. 5, silicon carbide substrate 11 having epitaxial growth layer 5 formed thereon is heated, thereby activating the impurities implanted in epitaxial growth layer 5. In this way, desired carriers are generated in the impurity regions of epitaxial growth layer 5.

Figure 6:
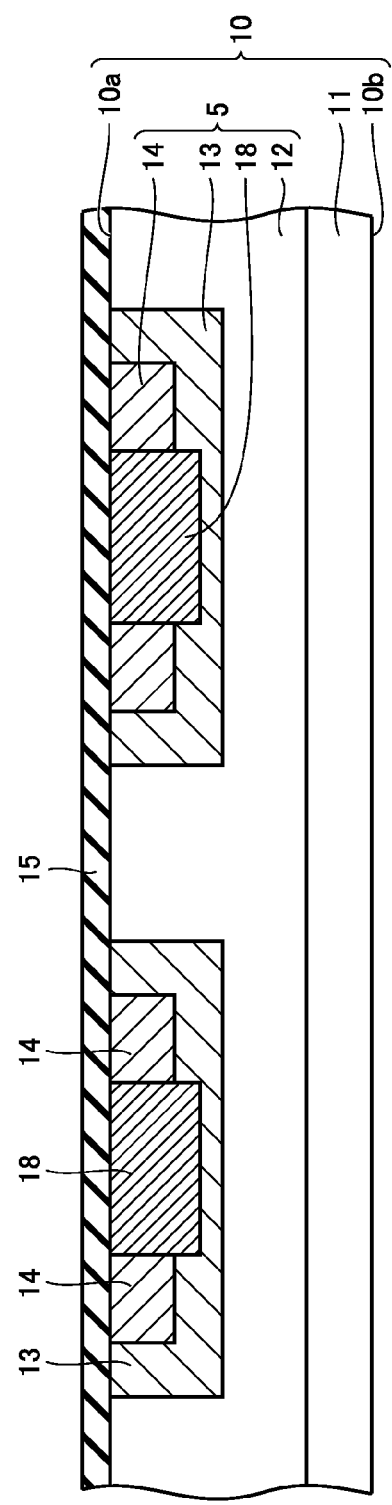
FIG. 6 is a schematic view for illustrating a step (S50) in the method for manufacturing the silicon carbide semiconductor device according to the first embodiment.

Next, a gate insulating film forming step is performed as a step (S50). In this step (S50), with reference to FIG. 6, for example, silicon carbide substrate 11 is heated in an atmosphere including oxygen ($O_2$), thereby forming gate insulating film 15 made of $SiO_2$ on first main surface 10a.

Figure 7:
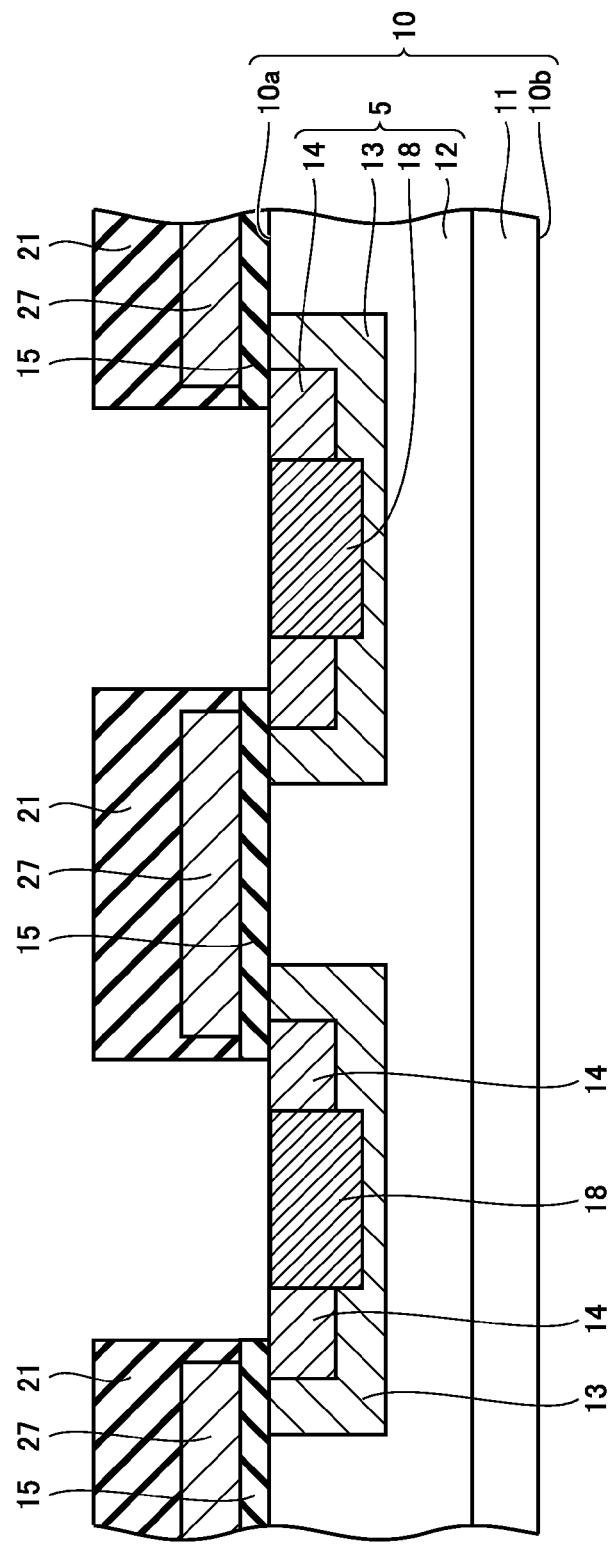
FIG. 7 is a schematic view for illustrating steps (S60) and (S70) in the method for manufacturing the silicon carbide semiconductor device according to the first embodiment.

Next, a gate electrode forming step is performed as a step (S60). In this step (S60), with reference to FIG. 7, for example, an LP (Low Pressure) CVD method is employed to form gate electrode 27 made of polysilicon or the like on and in contact with gate insulating film 15.

Next, an interlayer insulating film forming step is performed as a step (S70). In this step (S70), with reference to FIG. 7, interlayer insulating film 21 made of $SiO_2$ is formed by, for example, the CVD method such that interlayer insulating film 21 and gate insulating film 15 surround gate electrode 27.

Next, as a step (S80), an ohmic electrode forming step is performed. In this step (S80), with reference to FIG. 7, gate insulating film 15 and interlayer insulating film 21 are first removed by etching from a region in which source electrode 16 is to be formed. This leads to formation of a region in which source region 14 and contact region 18 are exposed. On this occasion, the contact width of source electrode 16 and source region 14 is determined. Then, in this region, a metal film made of, for example, Ni is formed. On the other hand, on second main surface 10b of silicon carbide substrate 11, a metal film made of Ni is formed in a similar manner. Then, silicon carbide substrate 11 is heated, thereby siliciding at least a portion of the metal film. Accordingly, as shown in FIG. 1, source electrode 16 is formed on first main surface 10a of silicon carbide layer 10 and drain electrode 20 is formed on second main surface 10b.

Next, a pad electrode forming step is performed as a step (S90). In this step (S90), with reference to FIG. 1, for example, a deposition method is employed to form source pad electrode 19, which is made of a conductor such as Al or gold (Au), so as to cover source electrode 16 and interlayer insulating film 21. Moreover, as with source pad electrode 19, back side pad electrode 23 made of Al, Au, or the like is formed to cover drain electrode 20. By performing the steps (S10) to (S90) as described above, MOSFET 1 is manufactured.

The following describes function and effect of MOSFET 1. Described first are function and effect provided by defining the relation between on resistance $R_{onA}$ and contact width n of source electrode 16 and source region 14.

Figure 19:
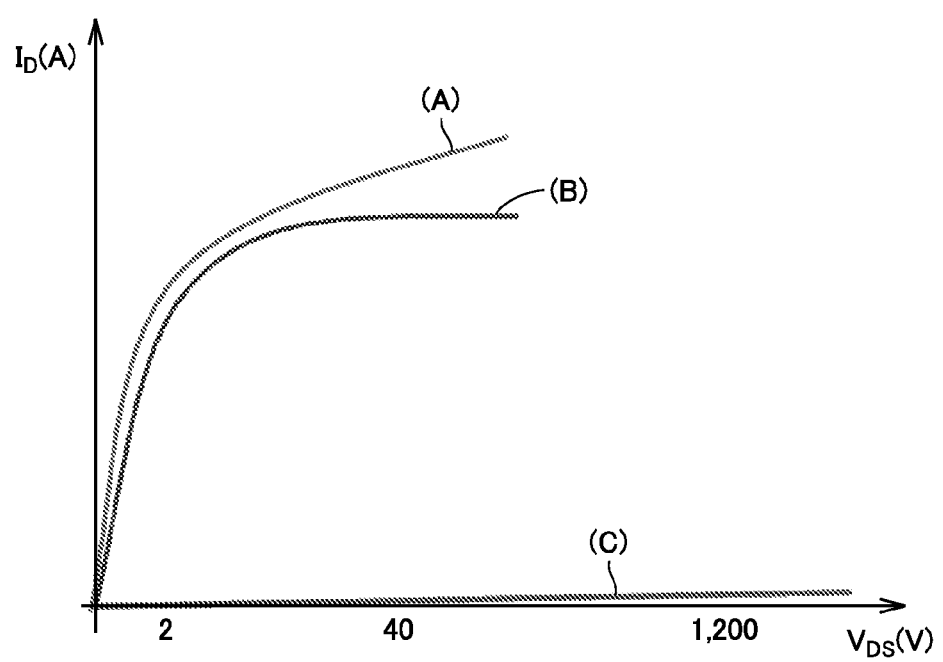
FIG. 19 is a graph for illustrating an I-V characteristic of a SiC-MOSFET.

First, a general current-voltage (I-V) characteristic of a SiC-MOSFET will be described with reference to FIG. 19. FIG. 19 is a graph showing the I-V characteristic of the SiC-MOSFET, the horizontal axis represents the drain voltage ($V_{DS}$), and the vertical axis represents the drain current ($I_D$). Moreover, in the graph of FIG. 19, (A) represents an actual I-V characteristic (on state) in the SiC-MOSFET, (B) represents an ideal I-V characteristic (on state) in the SiC-MOSFET, and (C) represents an I-V characteristic of the SiC-MOSFET in the off state.

With reference to FIG. 19, in the off state (C), substantially no drain current flows even when increasing the drain voltage, whereas in the on states (A) and (B), the drain current is increased as the drain voltage is increased. Meanwhile, in the ideal I-V characteristic represented by (B), as the drain voltage is increased, the drain current is increased in the low voltage region and the drain current is saturated in the high voltage region. In contrast, in the actual I-V characteristic represented by (A), the drain current tends to keep on increasing without saturation even in the high voltage region. Hence, a large amount of current may flow in the device if a high voltage is applied upon short circuit of load, which may result in breakage of an element. One conceivable cause for the fact that the drain current is not thus saturated in the high voltage region in the SiC-MOSFET is interface states existing in high density at an interface between the silicon carbide layer and the gate insulating film made of $SiO_2$. In other words, it is considered that carriers are trapped in the interface states, with the result that the drain current is not saturated.

Figure 20:
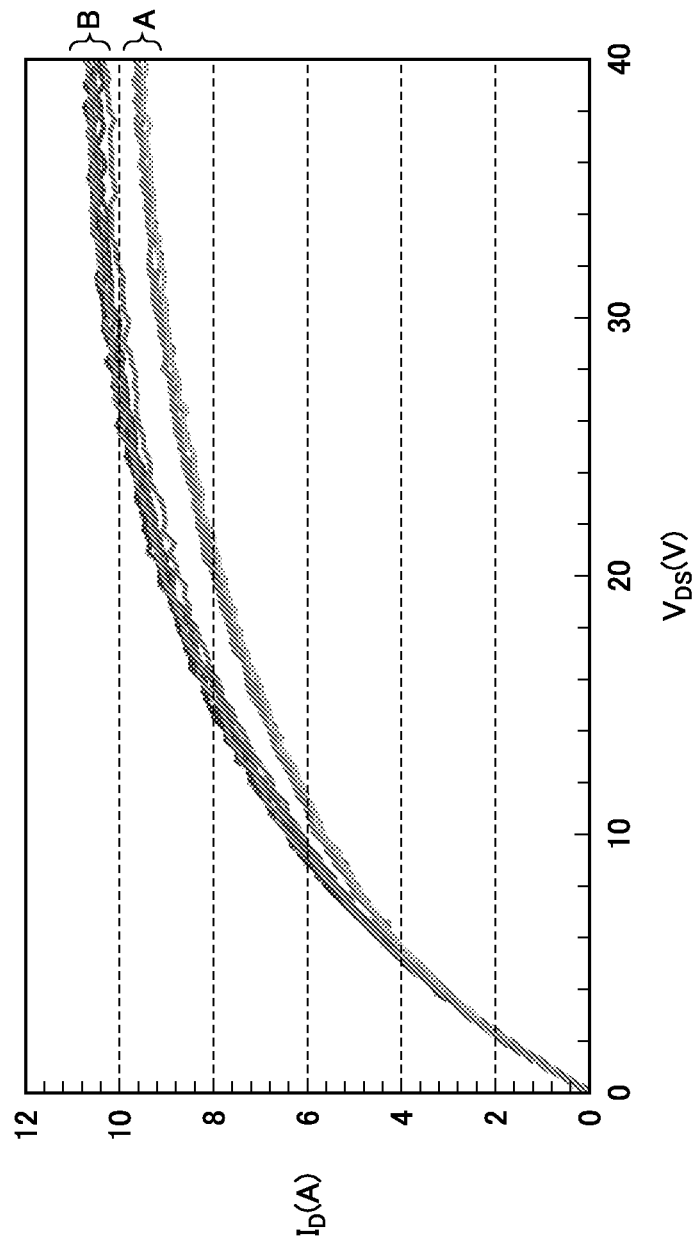
FIG. 20 is a graph showing the I-V characteristic of the SiC-MOSFET.

FIG. 20 is a graph showing an I-V characteristic of MOSFET 1 according to the present embodiment. In this graph, the horizontal axis represents the drain voltage ($V_{DS}$) and the vertical axis represents the drain current ($I_D$). This I-V characteristic represents an I-V characteristic attained when on resistance $R_{onA}$ of the MOSFET is 10 m$\Omega$cm$^2$ and the gate voltage ($V_{GS}$) is 20 V. Moreover, in this graph, (A) represents a graph when contact width n is 0.4 μm. Moreover, (B) represents a graph when contact width n is not less than 0.5 μm.

As apparent from comparison between both the graphs, in (A), a drain current comparable to that in (B) is obtained in the low voltage region (for example, $V_{DS}=2V$), and the drain current is reduced as compared with that in (B) in the high voltage region. Thus, in MOSFET 1, by defining the relation between contact width n and on resistance $R_{onA}$, the drain current in the high voltage region can be reduced further. More specifically, when the gate voltage is set at 20 V and the drain voltage is set at not less than 20V, current density in source region 14 is reduced to be not more than 30000 A/cm$^2$. As a result, in MOSFET 1, the breakage of element can be suppressed upon short circuit of load.

Figure 21:
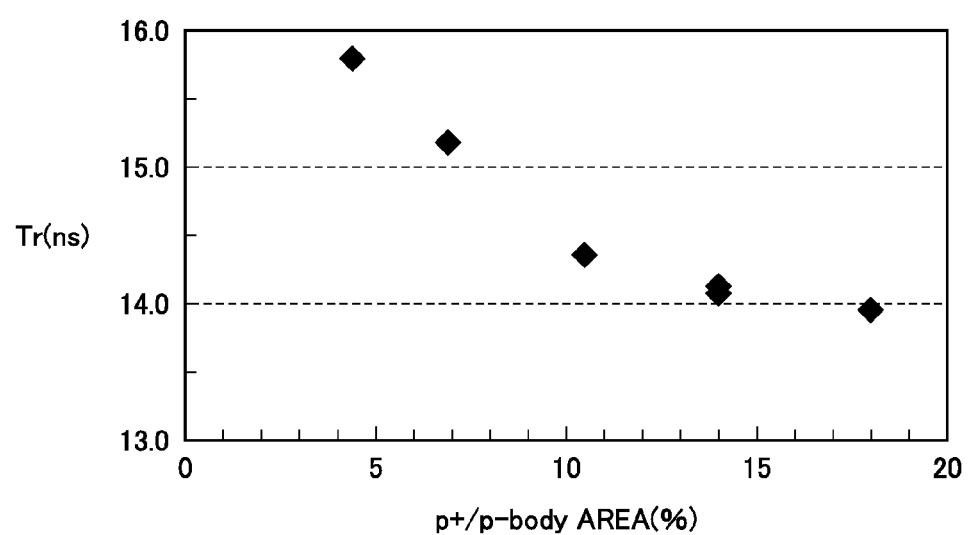
FIG. 21 is a graph showing a relation between turn-on time and a ratio of an area of a contact region to an area of a body region.
Figure 30:
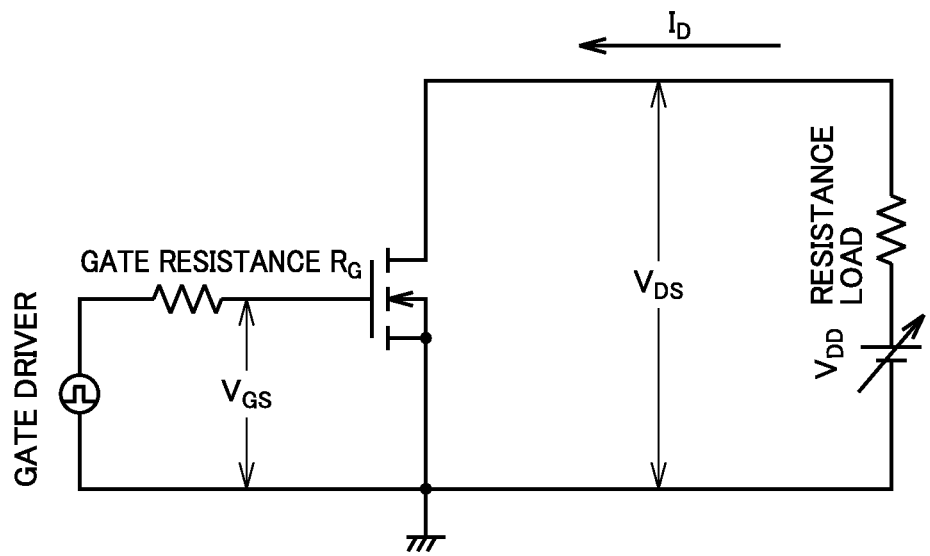
FIG. 30 shows a switching evaluation circuit.

Next, the following describes function and effect provided by defining the area of contact region 18 relative to the area of body region 13. The graph of FIG. 21 represents a relation between turn-on time and the ratio of the area of contact region 18 to the area of body region 13. In this graph, the horizontal axis represents the ratio of the area of contact region 18 to the area of body region 13 (p+/p−body area: %), and the vertical axis represents the turn-on time (Tr: second). The turn-on time can be measured using a switching evaluation circuit shown in FIG. 30. In FIG. 30, "$I_D$" represents the drain current, "$V_{GS}$" represents the gate voltage, "$V_{DS}$" represents the drain voltage, and "$V_{DD}$" represents the power supply voltage.

The areas of body region 13 and contact region 18 can be measured by a SEM or a SCM, for example. As the SEM, Quanta™ 3D FEG provided by FEI can be used, for example. A sample analysis region is 20 μm×20 μm, for example. An acceleration voltage is 2 kV, for example. A probe current is 15 pA, for example. As the SCM, Dimension 3100 provided by Bruker AXS can be used, for example. A sample analysis region is 10 μm×15 μm, for example. A modulation voltage is not less than 1 V and not more than 5 V, for example. A frequency is 100 Hz, for example. A DC bias is 0 V, for example.

As apparent from the graph of FIG. 21, by defining the area ratio at not less than 10%, the turn-on time of MOSFET 1 can be made short remarkably. The electric field fed to the gate oxide film is set at 2.3 MV/cm and the power supply voltage is set to be ½ of the breakdown voltage of the MOSFET. Moreover, the load resistance is selected to be a value of the drain current flowing when the drain voltage applied to the MOSFET is set at 2 V and the gate electric field is set at 2.3 MV/cm. When the gate resistance is set at 4.7 SΩ and the MOSFET is switched, the turn-on time can be reduced to be not more than 14.5 ns, preferably, not more than 14.0 ns. Thus, in MOSFET 1, by increasing the area of contact region 18 relative to the area of body region 13, the electric resistance between source electrode 16 and contact region 18 can be reduced. As a result, loss of the gate voltage applied between source electrode 16 and gate electrode 27 can be reduced, thereby further improving the switching property of MOSFET 1.

Second Embodiment

Figure 8:
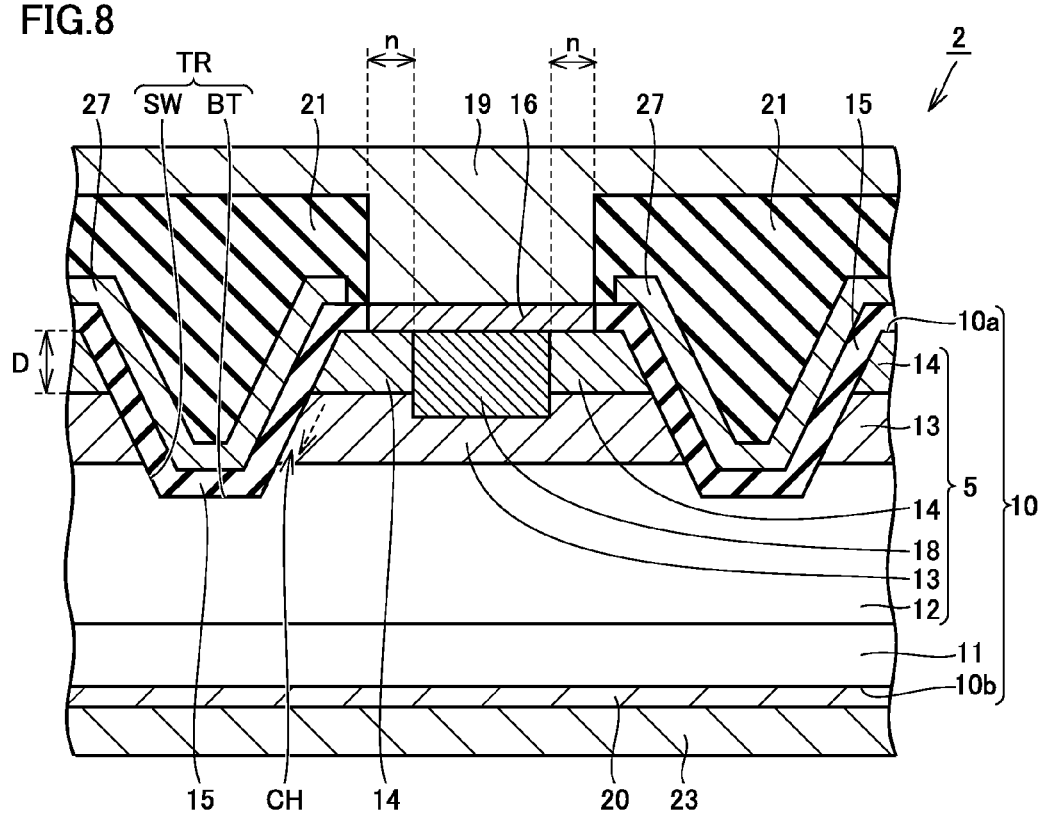
FIG. 8 is a schematic cross sectional view showing a structure of a silicon carbide semiconductor device according to a second embodiment.
Figure 9:
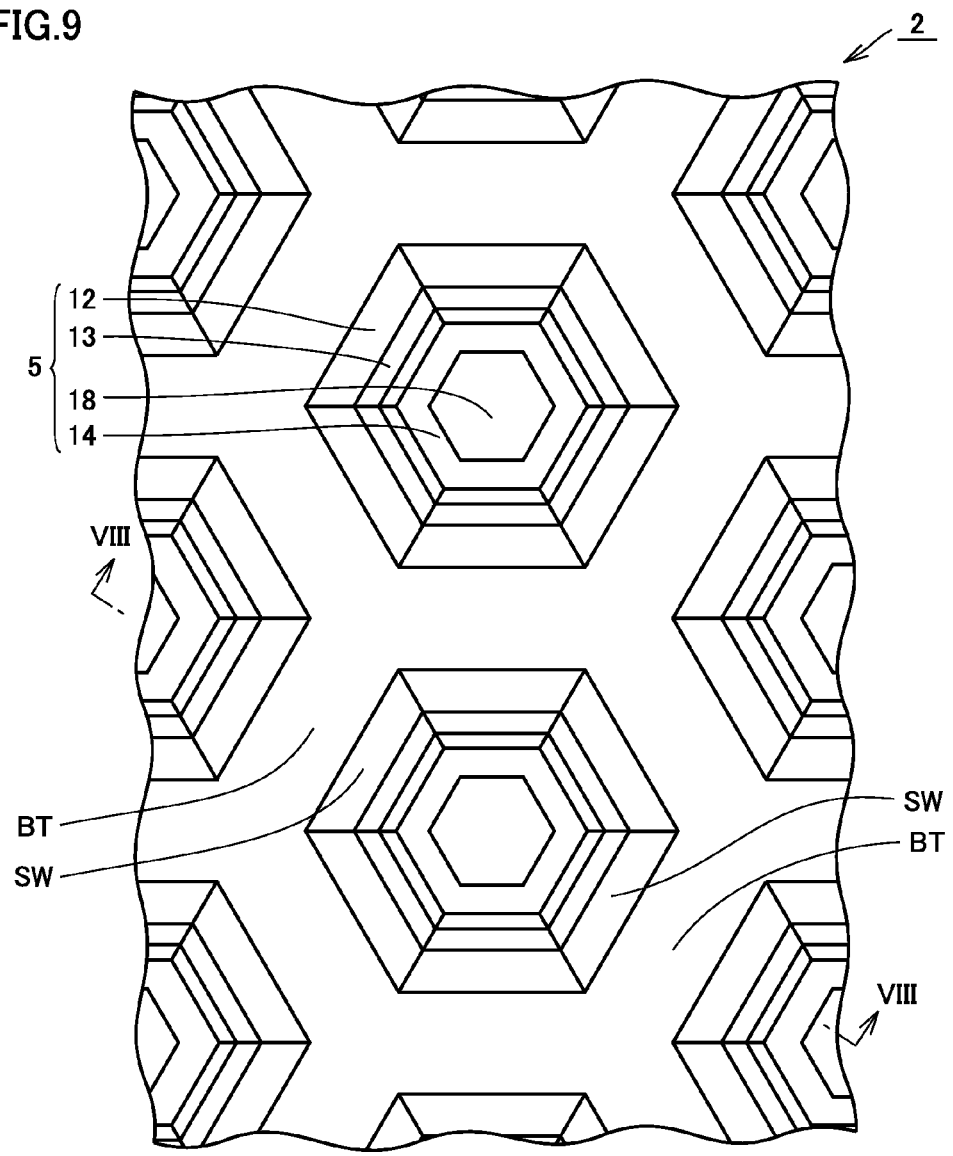
FIG. 9 is a schematic plan view showing the structure of the silicon carbide semiconductor device according to the second embodiment.

Next, with reference to FIG. 8 and FIG. 9, the following describes a structure of a MOSFET 2 serving as a silicon carbide semiconductor device according to a second embodiment. FIG. 8 shows a cross sectional structure of MOSFET 2 along a line segment VIII-VIII in FIG. 9.

MOSFET 2 has basically the same configuration as that of MOSFET 1 according to the first embodiment, operates in basically the same manner and provides basically the same effect. However, MOSFET 2 is different from planer type MOSFET 1 in that MOSFET 2 has a trench type device structure.

First, the structure of MOSFET 2 will be described. With reference to FIG. 8, as with the first embodiment, MOSFET 2 includes a silicon carbide layer 10, gate insulating films 15, gate electrodes 27, source electrodes 16, a drain electrode 20, a source pad electrode 19, a back side pad electrode 23, and interlayer insulating films 21. Moreover, as with the first embodiment, silicon carbide layer 10 includes a silicon carbide substrate 11 and an epitaxial growth layer 5. Moreover, as with the first embodiment, drift region 12, body regions 13, source regions 14, and contact regions 18 are formed in epitaxial growth layer 5.

In MOSFET 2, as with the first embodiment, in the case where the contact width of source region 14 and source electrode 16 is represented by n (μm) and the on resistance of MOSFET 2 is represented by $R_{onA}$ (mΩcm²), a relational expression of $0.1 \le n \le -0.02 R_{onA} + 0.7$ is established, and preferably a relational expression of $0.1 \le n \le -0.02 R_{onA} + 0.6$ is established. Moreover, when viewed in a plan view of first main surface 10a shown in FIG. 9, the area of contact region 18 is not less than 10%, preferably, 15% of the area of body region 13.

With reference to FIG. 8, a trench TR is formed in silicon carbide layer 10 to have an opening at the first main surface 10a side and have side wall surfaces SW and a bottom surface BT. Trench TR is formed to extend through source region 14 and body region 13 and to have bottom surface BT located in drift region 12. Moreover, on side wall surface SW, a portion of drift region 12, body region 13, and source region 14 are exposed. In the operation of MOSFET 2, whether to form the inversion layer in channel region CH, which is a region adjacent to side wall surface SW in body region 13, is controlled, whereby migration of carriers from source electrode 16 to drain electrode 20 is controlled as indicated by broken line arrows in FIG. 8.

(Special Plane)

Figure 22:
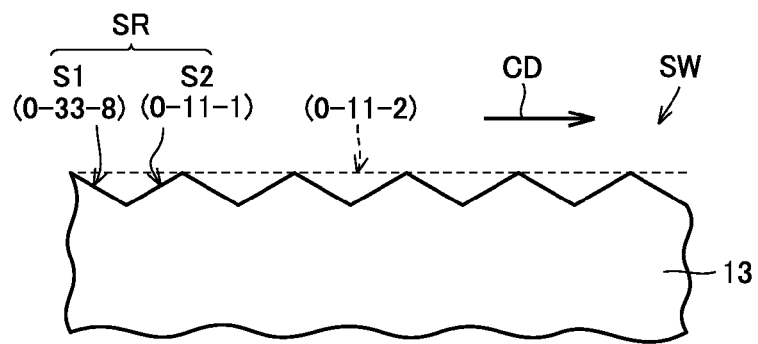
FIG. 22 is a partial cross sectional view schematically showing a fine structure of a surface of a silicon carbide layer included in the silicon carbide semiconductor device.

Side wall surface SW described above has a special plane particularly at its portion on body region 13. Side wall surface SW having such a special plane includes a plane S1 (first plane) having a plane orientation of {0-33-8} as shown in FIG. 22. In other words, on side wall surface SW of trench TR, body region 13 is provided with a surface including plane S1. Plane S1 preferably has a plane orientation of (0-33-8).

More preferably, side wall surface SW microscopically includes plane S1, and side wall surface SW microscopically further includes a plane S2 (second plane) having a plane orientation of {0-11-1}. Here, the term "microscopically" refers to "minutely to such an extent that at least the size about twice as large as an interatomic spacing is considered". For observation of the microscopic structure, a TEM can be used, for example. Plane S2 preferably has a plane orientation of (0-11-1).

Preferably, plane S1 and plane S2 of side wall surface SW constitute a combined plane SR having a plane orientation of {0-11-2}. In other words, combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

As the TEM, JEM-2100F provided by JEOL can be used, for example. A sample analysis region is 10 μm×10 μm×0.1 μm, for example. An acceleration voltage is 200 kV, for example. As the AFM, Dimension Icon SPM System provided by Veeco Instruments Japan can be used, for example. A sample analysis region is 90 μm×90 μm, for example. A scan rate is 0.2 Hz, for example. A chip rate is 8 μm/second, for example. An amplitude set point is 15.5 nm, for example. A Z range is 1 μm, for example. Each of the parameters described above is adjusted depending on samples. As an X-ray diffractometer, SmartLab provided by Rigaku can be used, for example. A sample analysis region is not less than 0.3 mmϕ and not more than 0.8 mmϕ, for example. A bulb used is Cu, for example. An output is 45 kV, 80 mA, for example. For example, after using the X-ray diffractometer to confirm that first main surface 10a corresponds to the (000-1) plane, side wall surface SW of trench TR is measured by the AFM.

Preferably, in the channel surface, carriers flow in a channel direction CD, in which the above-described periodic repetition is done.

Next, the detailed structure of combined plane SR will be described.

Figure 23:
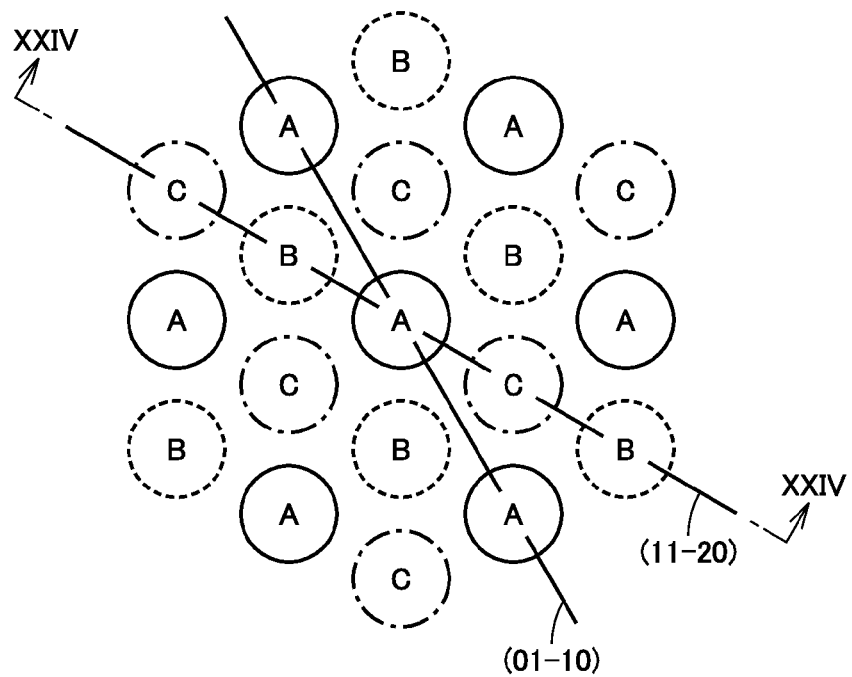
FIG. 23 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 23. In other words, with four layers ABCB being regarded as one period, a periodic stacking structure such as ABCBABCBABCB . . . is provided.

Figure 24:
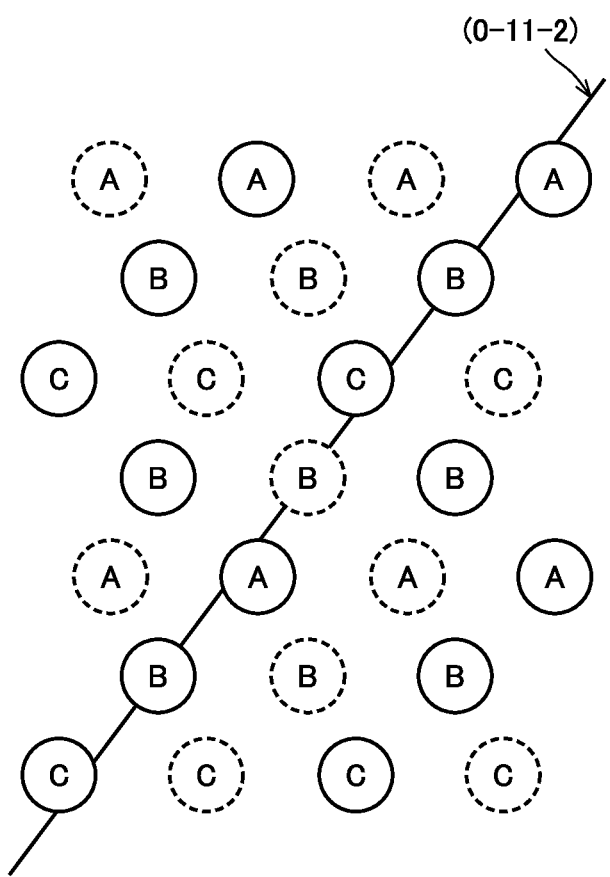
FIG. 24 shows a crystal structure of a (11-20) plane along a line XXIV-XXIV of FIG. 23.

As shown in FIG. 24, in the (11-20) plane (cross section taken along a line XXIV-XXIV of FIG. 23), atoms in each of four layers ABCB constituting the above-described one period are not aligned completely along the (0-11-2) plane. In FIG. 24, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 25:
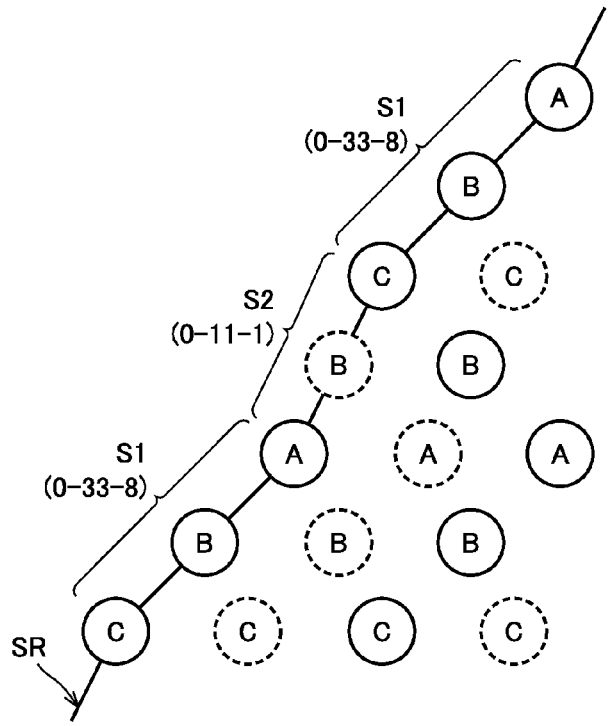
FIG. 25 shows a crystal structure in the vicinity of a surface with a combined plane of FIG. 22 within a (11-20) plane.

As shown in FIG. 25, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane Si and plane S2 being averaged corresponds to the (0-11-2) plane (FIG. 24).

Figure 26:
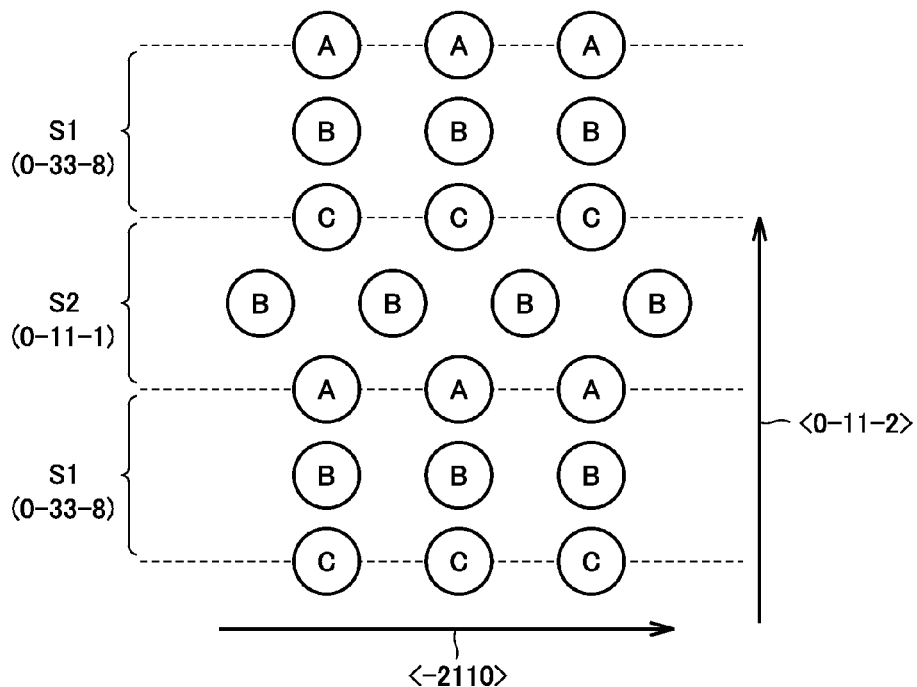
FIG. 26 shows the combined plane of FIG. 22 when viewed from a (01-10) plane.

As shown in FIG. 26, when viewing combined plane SR from the (01-10) plane, the single-crystal structure has a portion periodically including a structure (plane Si portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than polytype 4H, the surface can be thus constituted of the planes (planes S1 in FIG. 22) having a plane orientation of (001) in the structure equivalent to the cubic structure and the planes (planes S2 in FIG. 22) connected to the foregoing planes and having a plane orientation different from that of each of the foregoing planes. The polytype may be 6H or 15R, for example.

Figure 27:
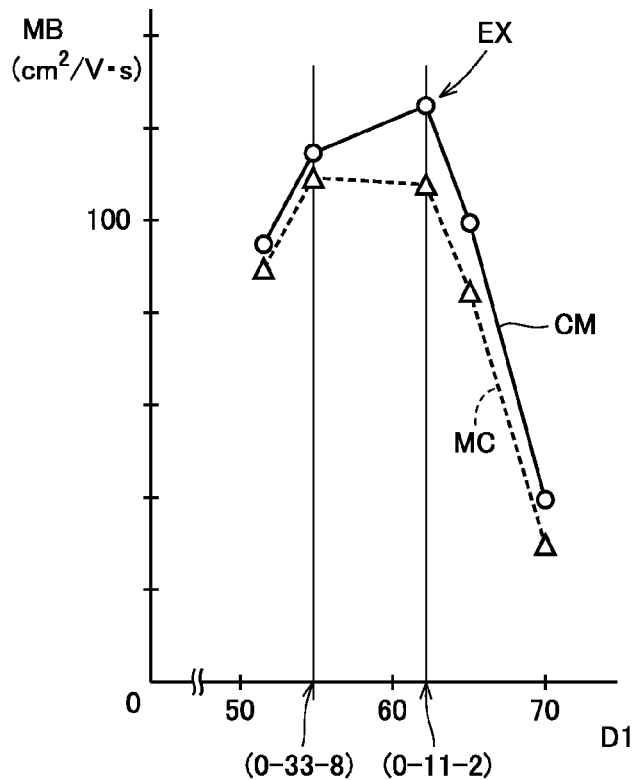
FIG. 27 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 27, the following describes a relation between the crystal plane of side wall surface SW and mobility MB of the channel surface. In the graph of FIG. 27, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 25 and FIG. 26, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 28:
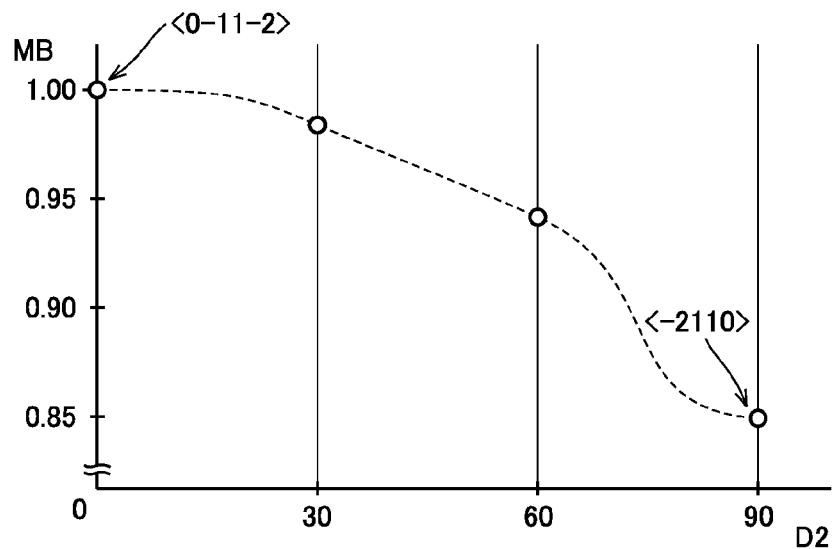
FIG. 28 is a graph showing an exemplary relation between the channel mobility and an angle between a channel direction and a <0-11-2> direction.

It should be noted that mobility MB has orientation dependency on combined plane SR. In a graph shown in FIG. 28, the horizontal axis represents an angle D2 between the channel direction and the <0-11-2> direction, whereas the vertical axis represents mobility MB (in any unit) in channel surface CH. A broken line is supplementarily provided therein for viewability of the graph. From this graph, it has been found that in order to increase channel mobility MB, channel direction CD (FIG. 22) preferably has an angle D2 of not less than 0° and not more than 60°, more preferably, substantially 0°.

Figure 29:
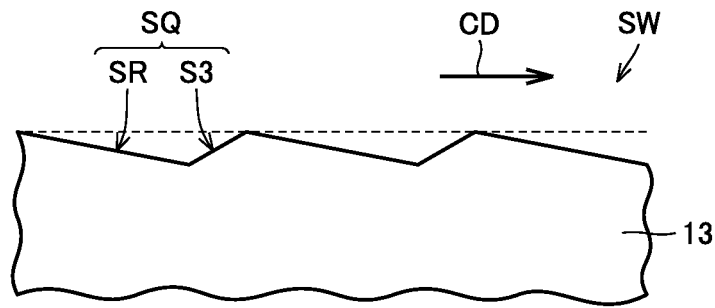
FIG. 29 shows a modification of FIG. 22.

As shown in FIG. 29, side wall surface SW may further include plane S3 (third plane) in addition to combined plane SR. More specifically, side wall surface SW may include a combined plane SQ constituted of periodically repeated plane S3 and combined plane SR. In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by the TEM or the AFM, for example. Specific examples of the measuring device, the sample analysis region, and the measurement condition have been described above.

Figure 10:
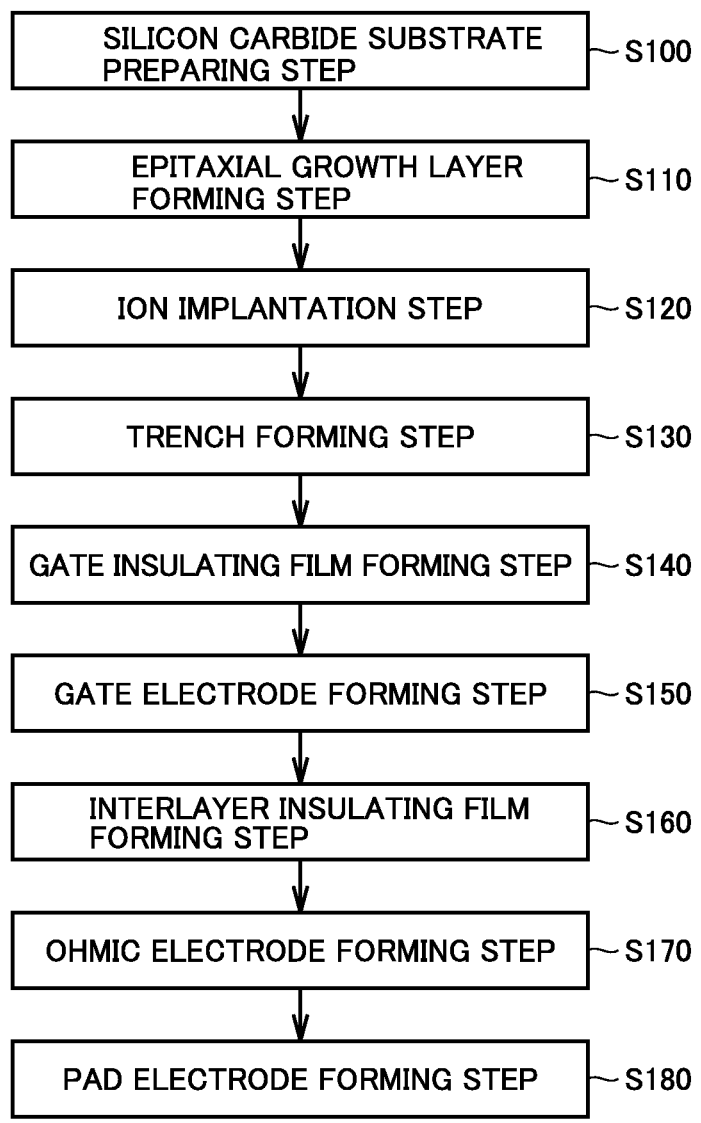
FIG. 10 is a flowchart schematically showing a method for manufacturing the silicon carbide semiconductor device according to the second embodiment.
Figure 11:
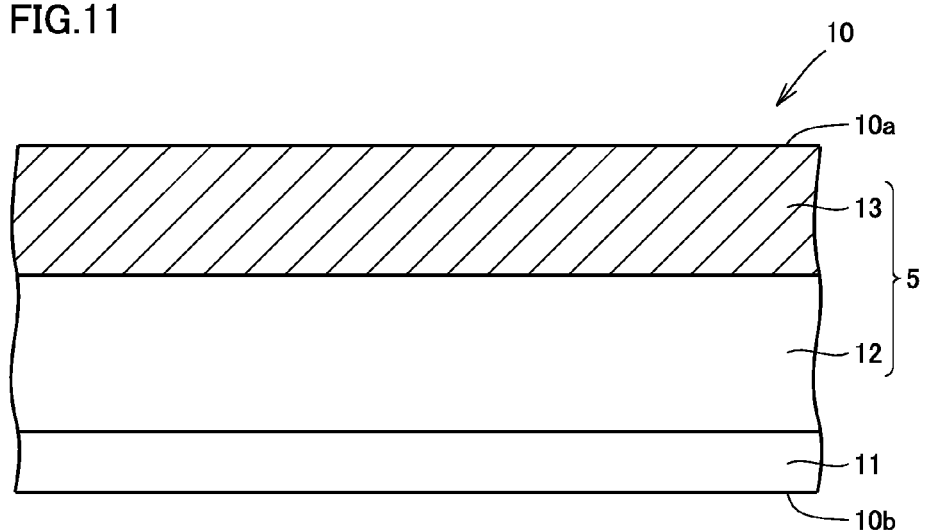
FIG. 11 is a schematic view for illustrating steps (S100) to (S120) in the method for manufacturing the silicon carbide semiconductor device according to the second embodiment.

The following describes a method for manufacturing MOSFET 2. With reference to FIG. 10, a silicon carbide substrate preparing step is first performed as a step (S100). In this step (S100), with reference to FIG. 11, silicon carbide substrate 11 is prepared in the same manner as in the step (S10) of the first embodiment.

Next, an epitaxial growth layer forming step is performed as a step (S110). In this step (S110), with reference to FIG. 11, epitaxial growth layer 5 is formed on silicon carbide substrate 11 in the same manner as in the step (S20) of the first embodiment.

Figure 12:
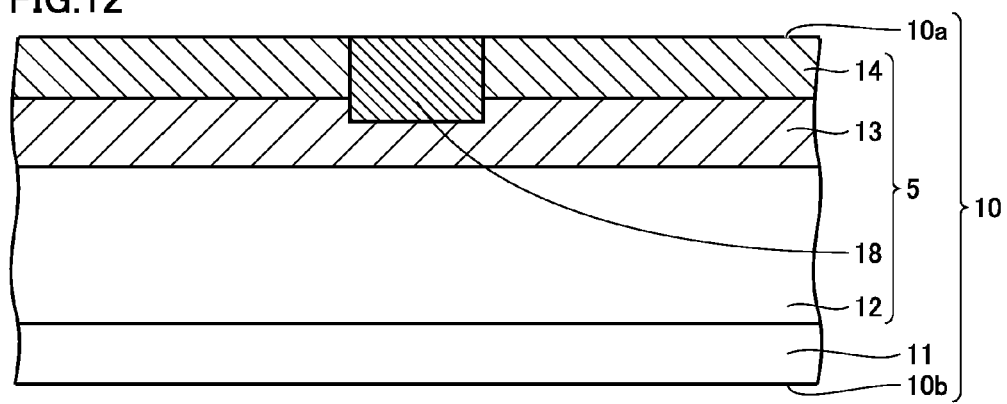
FIG. 12 is a schematic view for illustrating the step (S120) in the method for manufacturing the silicon carbide semiconductor device according to the second embodiment.

Next, an ion implantation step is performed as a step (S120). In this step (S120), with reference to FIG. 11 and FIG. 12, Al ions and P ions are implanted into epitaxial growth layer 5 from the first main surface 10a side in the same manner as in the step (S30) of the first embodiment. Accordingly, in epitaxial growth layer 5, drift region 12, body region 13, source region 14, and contact region 18 are formed.

Figure 13:
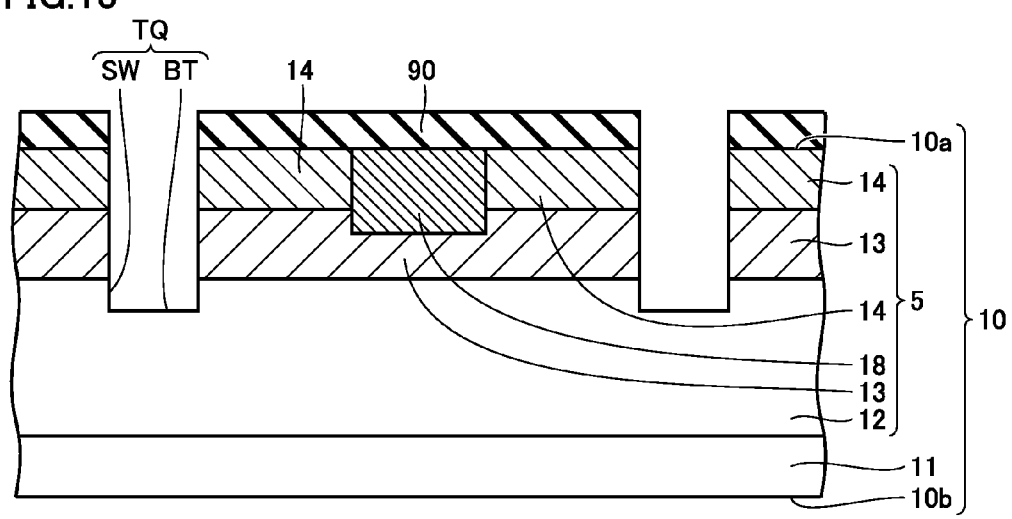
FIG. 13 is a schematic view for illustrating a step (S130) in the method for manufacturing the silicon carbide semiconductor device according to the second embodiment.

Next, a trench forming step is performed as a step (S130). In this step (S130), with reference to FIG. 13, a mask layer 90 having an opening in conformity with a region in which trench TR is to be formed is first formed on first main surface 10a constituted of source region 14 and contact region 18. Mask layer 90 is made of, for example, SiO$_2$.

Next, in the opening of mask layer 90, source region 14, body region 13, and drift region 12 are removed by etching. Examples of the etching method usable herein include reactive ion etching, particularly, Inductive Coupled Plasma Reactive Ion Etching (ICP-RIE). On this occasion, sulfur hexafluoride (SF$_6$) or a mixed gas of SF$_6$ and O$_2$ can be used as reactive gas. Accordingly, in the region in which trench TR is to be formed, a recess TQ is formed to have side wall surfaces SW substantially perpendicular to first main surface 10a and have a bottom surface BT continuously connected to side wall surface SW and substantially parallel to first main surface 10a.

Next, thermal etching is performed in recess TQ. This thermal etching is performed by, for example, heating silicon carbide substrate 11 in an atmosphere containing reactive gas having at least one or more types of halogen atom. This reactive gas is gas including chlorine (Cl$_2$), boron trichloride (BCl$_3$), SF$_6$, carbon tetrafluoride (CF$_4$), or the like, for example. In the present embodiment, a mixed gas of chlorine gas and oxygen gas is employed as the reactive gas, and thermal etching is performed at a heat treatment temperature of not less than 700° C. and not more than 1000° C., for example.

Figure 14:
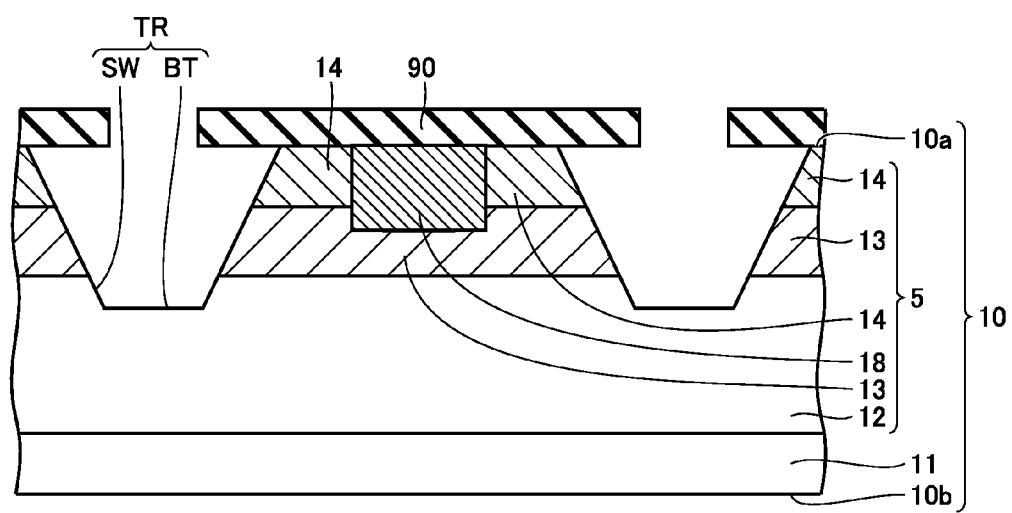
FIG. 14 is a schematic view for illustrating the step (S130) in the method for manufacturing the silicon carbide semiconductor device according to the second embodiment.
Figure 15:
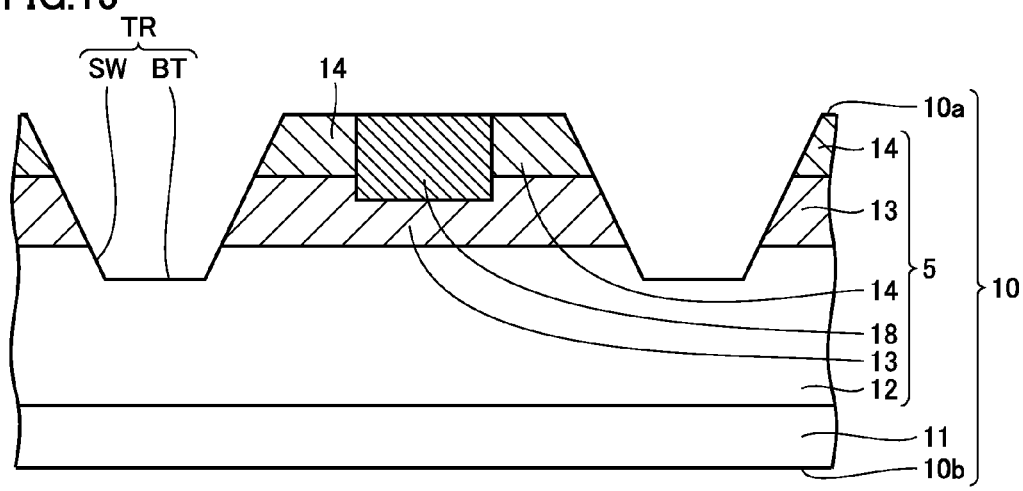
FIG. 15 is a schematic view for illustrating the step (S130) in the method for manufacturing the silicon carbide semiconductor device according to the second embodiment.

With reference to FIG. 14, by the thermal etching, trench TR is formed to have an opening at the first main surface 10a side. Trench TR includes: side wall surface SW extending to drift region 12 through source region 14 and body region 13; and bottom surface BT located in drift region 12. After completion of the thermal etching, mask layer 90 is removed by an appropriate method such as etching (FIG. 15). Here, the ratio of the area of contact region 18 to the area of body region 13 is determined.

Figure 16:
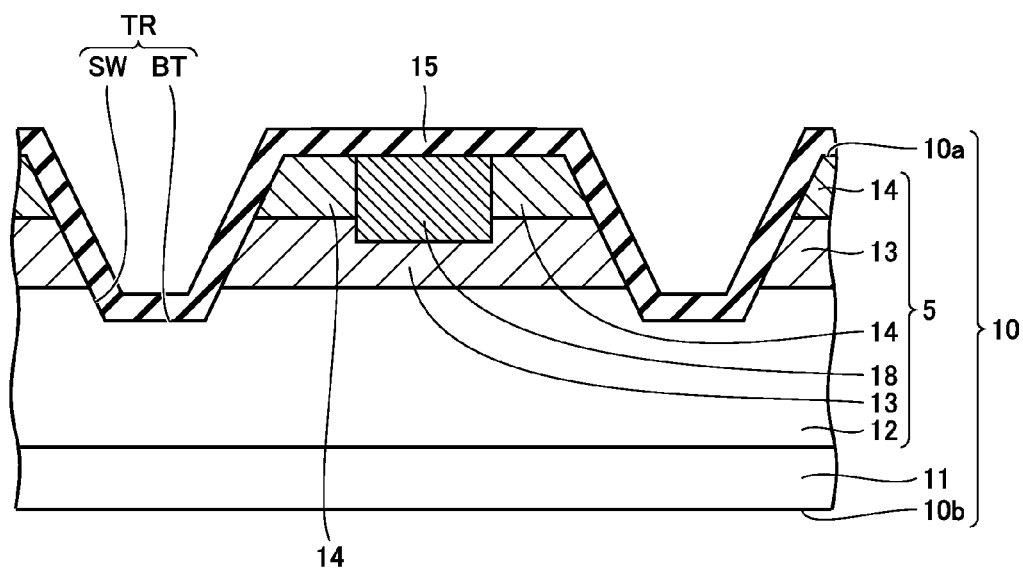
FIG. 16 is a schematic view for illustrating a step (S140) in the method for manufacturing the silicon carbide semiconductor device according to the second embodiment.

Next, a gate insulating film forming step is performed as a step (S140). In this step (S140), with reference to FIG. 16, silicon carbide substrate 11 is heated in an atmosphere including oxygen (O$_2$) in the same manner as in the step (S50) of the first embodiment, for example. Accordingly, gate insulating film 15 made of SiO$_2$ is formed to cover first main surface 10a and side wall surface SW and bottom surface BT of trench TR.

Figure 17:
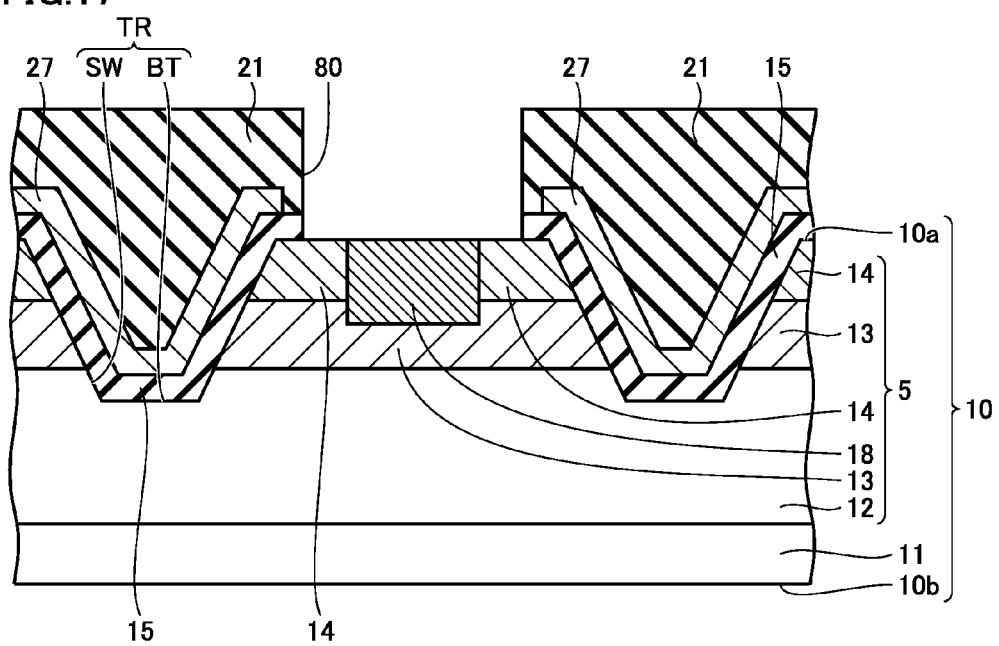
FIG. 17 is a schematic view for illustrating steps (S150) to (S170) in the method for manufacturing the silicon carbide semiconductor device according to the second embodiment.

Next, a gate electrode forming step is performed as a step (S150). In this step (S150), with reference to FIG. 17, as with the step (S60) of the first embodiment, the LPCVD method or the like is employed to form gate electrode 27 on gate insulating film 15 in trench TR.

Next, an interlayer insulating film forming step is performed as a step (S160). In this step (S160), with reference to FIG. 17, as with the step (S70) of the first embodiment, the CVD method or the like is employed to form interlayer insulating film 21 made of SiO$_2$.

Next, an ohmic electrode forming step is performed as a step (S170). In this step (S170), with reference to FIG. 17, gate insulating film 15 and interlayer insulating film 21 are first removed by etching from the region in which source electrode 16 is to be formed. On this occasion, the contact width of source electrode 16 and source region 14 is determined. Next, with reference to FIG. 8, for example, a metal film made of Ni is formed in the region in which source region 14 and contact region 18 are exposed. On the other hand, similarly on second main surface 10b of silicon carbide substrate 11, a metal film made of Ni is formed. Then, silicon carbide substrate 11 is heated, thereby forming source electrode 16 on first main surface 10a of silicon carbide layer 10 and drain electrode 20 on second main surface 10b as with the case of the first embodiment.

Next, a pad electrode forming step is performed as a step (S180). In this step (S180), with reference to FIG. 8, as with the step (S90) of the first embodiment, source pad electrode 19 and back side pad electrode 23 are formed. By performing the steps (S100) to (S180) as described above, MOSFET 2 is manufactured.

The silicon carbide semiconductor device according to the present disclosure can be applied particularly advantageously to a silicon carbide semiconductor device required to suppress breakage of an element upon short circuit of load.

It should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A silicon carbide semiconductor device comprising:
a silicon carbide layer including a first main surface and a second main surface opposite to said first main surface, said silicon carbide layer including
a first impurity region that has a first conductivity type,
a second impurity region that is in contact with said first impurity region and that has a second conductivity type different from said first conductivity type, and
a third impurity region that constitutes a portion of said first main surface, that is formed to interpose said second impurity region between said third impurity region and said first impurity region, and that has said first conductivity type;
a gate insulating film formed on said second impurity region;
a gate electrode formed on said gate insulating film;
a first electrode that is in contact with said third impurity region in said first main surface and that is electrically connected to said third impurity region; and
a second electrode that is formed on said second main surface and that is electrically connected to said silicon carbide layer,
the silicon carbide semiconductor device being configured such that migration of carriers between said first electrode and said second electrode is controlled by controlling a voltage applied to said gate electrode,
the silicon carbide semiconductor device being configured such that a relational expression of $n \leq -0.02R_{onA}+0.7$ is established in a case where a contact width of said third impurity region and said first electrode is represented by n (μm) in a cross section in a thickness direction of said silicon carbide layer and a migration direction of said carriers in said second impurity region and where on resistance of said silicon carbide semiconductor device in an on state is represented by $R_{onA}$ (mΩcm$^2$).

2. The silicon carbide semiconductor device according to claim 1, wherein the silicon carbide semiconductor device is configured such that a relational expression of $n \leq -0.02R_{onA}+0.6$ is established.

3. The silicon carbide semiconductor device according to claim 1, wherein the silicon carbide semiconductor device is configured such that said on resistance is not less than 1 mΩcm$^2$ and not more than 15 mΩcm$^2$.

4. The silicon carbide semiconductor device according to claim 1, wherein said contact width is not less than 0.1 μm.

5. The silicon carbide semiconductor device according to claim 1, wherein the silicon carbide semiconductor device is configured such that contact resistance between said first electrode and said third impurity region is not more than $1\times10^{-5}$ mΩcm².

6. The silicon carbide semiconductor device according to claim 1, wherein
the silicon carbide semiconductor device is configured such that the migration of said carriers is controlled by controlling whether to form an inversion layer in a channel region of said second impurity region, and
the silicon carbide semiconductor device is configured such that said inversion layer is formed in said channel region in said on state.

7. The silicon carbide semiconductor device according to claim 6, wherein
said second impurity region constitutes a portion of said first main surface, and
the silicon carbide semiconductor device is configured to control whether to form said inversion layer in said channel region, which is a region adjacent to said first main surface in said second impurity region.

8. The silicon carbide semiconductor device according to claim 6, wherein
a trench is formed in said silicon carbide layer to have an opening at the first main surface side and have a wall surface on which a portion of said second impurity region is exposed, and
the silicon carbide semiconductor device is configured to control whether to form said inversion layer in said channel region, which is a region adjacent to said wall surface in said second impurity region.

9. The silicon carbide semiconductor device according to claim 8, wherein on said wall surface of said trench, said second impurity region is provided with a surface including a first plane having a plane orientation of {0-33-8}.

10. The silicon carbide semiconductor device according to claim 9, wherein said surface microscopically includes said first plane, and said surface microscopically further includes a second plane having a plane orientation of {0-11-1}.

11. The silicon carbide semiconductor device according to claim 10, wherein said first and second planes of said surface constitutes a combined plane having a plane orientation of {0-11-2}.

12. The silicon carbide semiconductor device according to claim 11, wherein said surface macroscopically has an off angle of 62°±10° relative to a {000-1} plane.

13. The silicon carbide semiconductor device according to claim 1, wherein the silicon carbide semiconductor device is configured such that a current density in said third impurity region is not more than 30000 A/cm² when a voltage of 20 V is applied to said gate electrode and a voltage of not less than 20 V is applied between said first and second electrodes.

* * * * *